(12) United States Patent
Bennett et al.

(10) Patent No.: US 6,898,837 B1
(45) Date of Patent: May 31, 2005

(54) TOOLING FIXTURE

(75) Inventors: Ricky Bennett, Flemington, NJ (US);
Charles Moncavage, Easton, PA (US);
Bernward Starke, Dorchester (GB);
Jason Mark Edelstein, Weymouth (GB); Ian Gordon Wood, Weymouth (GB)

(73) Assignee: DEK Printing Machines, Ltd., Dorset (GB)

( * ) Notice: Subject to any disclaimer, the term of this patent is extended or adjusted under 35 U.S.C. 154(b) by 361 days.

(21) Appl. No.: 10/018,479

(22) PCT Filed: Jun. 21, 2000

(86) PCT No.: PCT/GB00/02403

§ 371 (c)(1),
(2), (4) Date: May 10, 2002

(87) PCT Pub. No.: WO00/79858

PCT Pub. Date: Dec. 28, 2000

Related U.S. Application Data

(63) Continuation-in-part of application No. 09/524,764, filed on Mar. 13, 2000, now Pat. No. 6,711,797, which is a continuation-in-part of application No. 09/337,895, filed on Jun. 21, 1999, now abandoned.

(51) Int. Cl.$^7$ .......................... B23Q 17/00; B25B 27/14; B21C 51/00
(52) U.S. Cl. ........................ 29/559; 29/281.6; 72/20.1
(58) Field of Search .................. 29/407.81, 559, 29/281.6; 72/20.1, 28.1, 21.1, 21.4, 453.13; 269/20, 21, 22, 24, 27, 28; 137/101.11, 154

(56) References Cited

U.S. PATENT DOCUMENTS 3,795,110 A 3/1974 Kobelt .......................... 60/413

| 4,170,971 | A | 10/1979 | Yamanaka et al. ........ 123/119 A |
| 4,635,466 | A | 1/1987 | Seki et al. ................ 72/453.13 |
| 5,157,438 | A | 10/1992 | Beale ............................ 355/72 |
| 5,551,677 | A | 9/1996 | Puettmer et al. ............ 269/266 |
| 5,687,598 | A | 11/1997 | Kirii et al. .................... 72/21.5 |
| 5,752,446 | A | 5/1998 | Squibb ......................... 101/486 |
| 5,761,951 | A | 6/1998 | Codatto ....................... 72/420 |
| 5,832,805 | A | * 11/1998 | Kurashima et al. ............ 91/29 |
| 6,029,966 | A | 2/2000 | Hertz et al. .................. 269/266 |
| 6,032,788 | A | 3/2000 | Smithers et al. ............ 198/817 |
| 6,202,999 | B1 | 3/2001 | Wayman et al. ............ 269/309 |

FOREIGN PATENT DOCUMENTS

| EP | 0499386 | 8/1995 |
| EP | 0954211 | 11/1999 |
| GB | 2322089 | 8/1998 |
| JP | 7022794 | 1/1995 |
| WO | WO 00/08905 | 2/2000 |

OTHER PUBLICATIONS

International Search Report mailed Oct. 18, 2000.

\* cited by examiner

*Primary Examiner*—John C. Hong
(74) *Attorney, Agent, or Firm*—Reed Smith, LLP

(57) ABSTRACT

A tooling fixture for supporting a workpiece, comprising: a body including a surface over which a workpiece is in use supported and a plurality of bores therein; a plurality of supporting elements (12) for supporting the workpiece, each slideably disposed in a respective one of the bores such as to be extendable from the surface of the body; at least one fluid reservoir (9) operably in fluid communication with the supporting elements such as to cause sliding of ones of the supporting elements on displacement of the fluid in the at least one fluid reservoir, and fluid control means (53) for displacing the fluid in the at least one reservoir such as to cause the supporting elements to be extended to a supporting position in contact with the workpiece and locking the supporting elements in the supporting position.

34 Claims, 18 Drawing Sheets

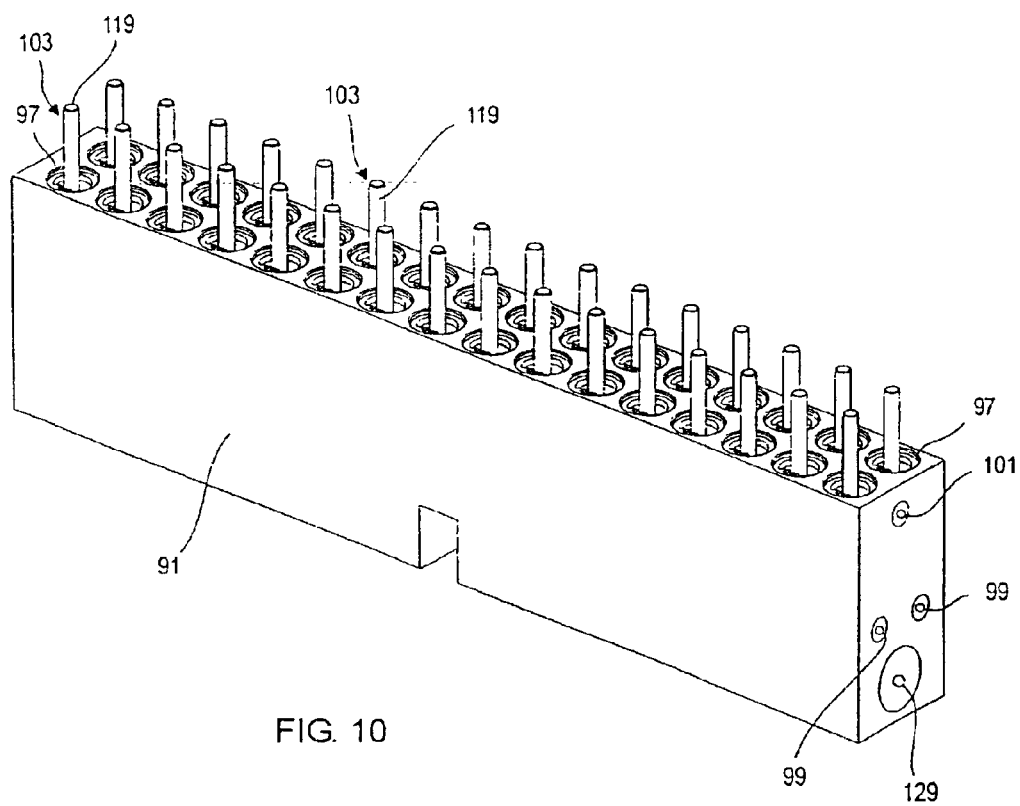
FIG. 10
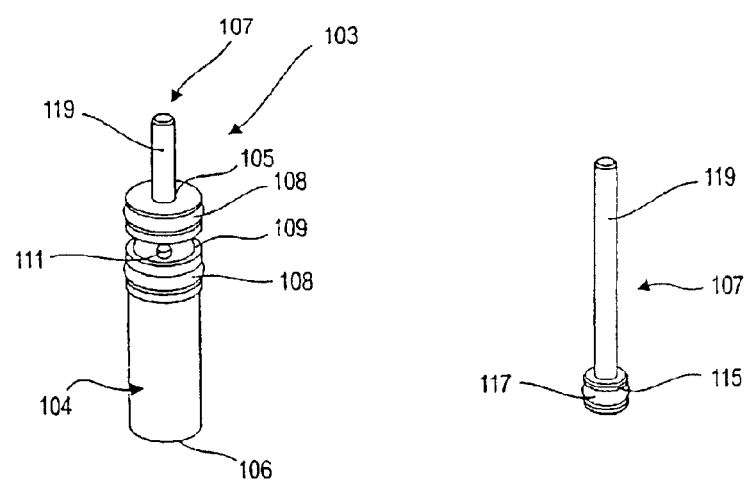
FIG. 11
FIG. 12

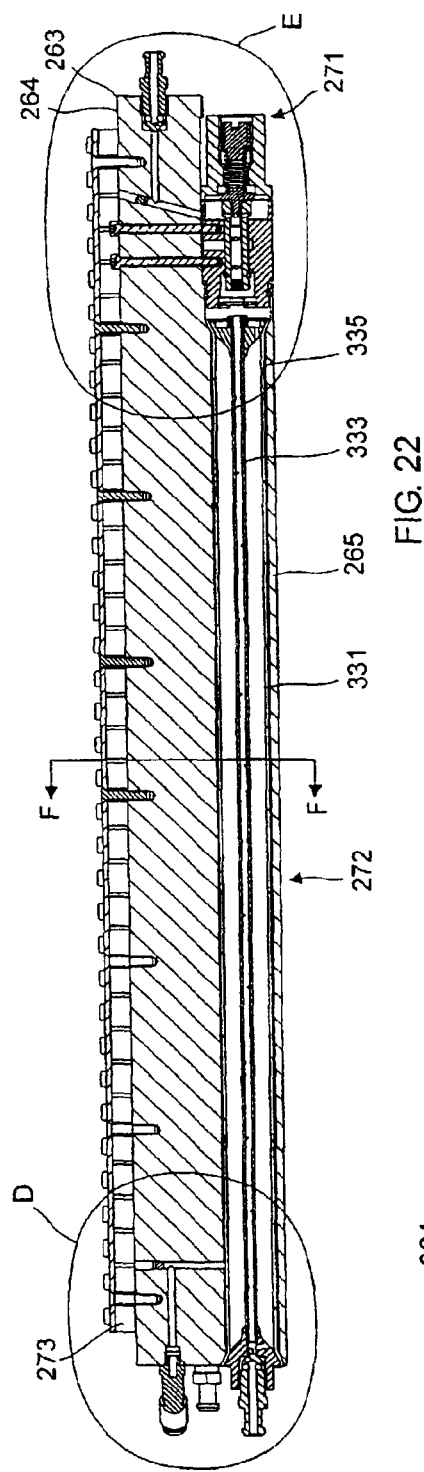
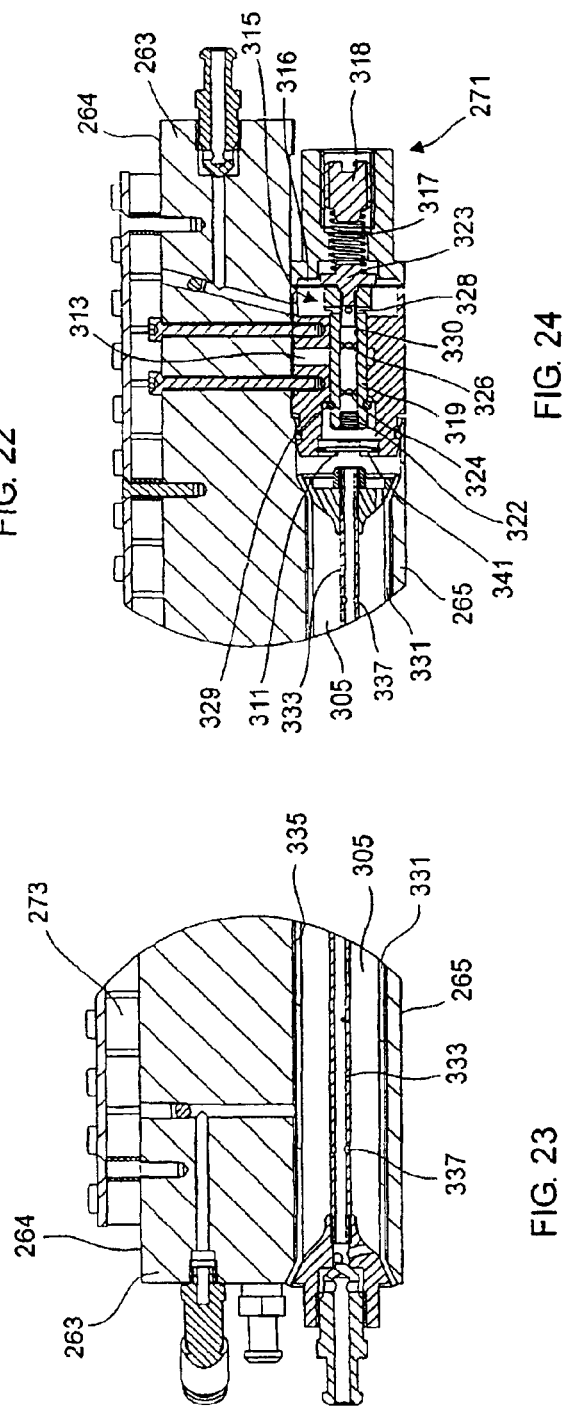
FIG. 22
FIG. 24
FIG. 23

TOOLING FIXTURE

This application is a 371 of PCT/GB00/02403 Jun. 21, 2000 which is a continuation-in-part of 09/524,764 Mar. 13, 2000 U.S. Pat. No. 6,711,797 which is a continuation-in-part of 09/337,895 Jun. 21, 1999 ABN.

The present invention relates to a tooling fixture for and a method of supporting a workpiece. In particular, the present invention relates to a hydraulic tooling fixture for supporting a flexible substrate such as a printed circuit board in a screen printing machine or a placement machine.

The fabrication of large volumes of electronic circuits is in practice accomplished using automated equipment. Typically, a viscous solder paste is first applied to a printed circuit board using a stencil printing machine, with the solder paste being applied to selected areas of a printed circuit board through a stencil, and electronic components are then placed on the applied solder paste using a placement machine, often referred to as a pick-and-place machine. The printed circuit board and components are then heated in a re-flow oven to a temperature sufficient to melt the solder paste, causing the molten solder to flow over the leads of the components and adjacent areas of the printed circuit board, and thereby form solder joints to complete the electronic circuit.

Such screen printing machines and placement machines normally include a tooling fixture for supporting the lower surface of the printed circuit board during processing. In screen printing machines, the printed circuit board is raised by the tooling fixture until the upper surface of the printed circuit board contacts the stencil. In this raised positions solder paste is applied under pressure to the upper surface of the stencil. The pressure applied by the printing head forces solder paste through the apertures in the stencil and onto the upper surface of the printed circuit board, with the tooling fixture preventing flexure of the printed circuit board away from the stencil during printing. In placement machines, a pick-and-place head sequentially presses electronic components onto predetermined locations on the printed circuit board, with the tooling fixture preventing the printed circuit board from flexing as pressure is applied thereto by the pick-and-place head.

Where components are provided on only one surface of the board, the tooling fixtures merely have to support a flat surface, and only slight modifications need to be made to the fixtures to accommodate boards of different dimension. However, in order to better utilize the surface area of printed circuit boards and produce more compact circuitry, components are often placed on both surfaces of those boards. In such cases, after components have been mounted to one surface of the board, the board is then inverted and components are mounted to the other surface of the board. Consequently, a second tooling fixture is required which conforms to the three-dimensional surface created by the components mounted on the one surface of the board. Since each different circuit layout has a different three-dimensional shape, this second tooling fixture has to be customized for each layout.

A customized tooling fixture can be formed by manually arranging blocks on the upper surface of the tooling fixture such as to contact the portions of the board not populated by components. However, this technique is time consuming because an operator must re-position the blocks each time a printed current board having a different circuit layout is to be processed. This technique is particularly cumbersome when a large number of different types of circuit boards are fabricated on the same assembly line.

A customized tooling fixture can also be provided by an array of electronically-addressable posts which are retracted at positions where a component is mounted to the printed current board, and extended to contact the board surface to provide support. A computer program directs the tooling fixture to configure the posts to conform to each printed circuit board to be fabricated. This method provides a faster means to change from one tooling configuration to another as compared to the manual assembly of blocks. However, a separate computer database must be created for the layout of each board. Further, since no support is provided to the board in areas populated by components, certain areas of the board may be inadequately supported. Unsupported areas of the board can flex during processing resulting in misalignment between the stencil or the pick-and-place head and the board.

A customized tooling fixture can further be provided by a robot mechanism which draws support pillars from a reservoir and locates those pillars in the required positions to support the board. This method is faster and more consistent than manually arranging support blocks, but again a separate computer database for each board type in order to define where pillars should be located, and can only provide support where there is clear space on the board to contact the pillars.

Prior to using a customized fixture with a new board layout, an operator must carefully inspect the fit between the tooling fixture and the board to make certain that misalignment and dimensional tolerances do not cause a block, extended post or positioned pillar to contact a component. Such contact will cause the tooling fixture to flex the board upward resulting in misplacement of the solder paste or components. More importantly, flexure of the board upwardly against the stencil can cause damage to the stencil or printing head of the screen printing machine.

Inspection of the tooling fixture each time a new type of board is to be fabricated complicates the manufacturing process and lowers throughput. Further, if the operator fails to properly inspect the fit between the board and the tooling fixture, large numbers of misaligned boards may be produced or costly damage to the equipment may result.

Furthermore, even when a fabrication line produces only a single type of printed circuit board, each surface of the board requires a different tooling fixture surface. A "flat" tooling fixture supports the unpopulated surface of the board while the other surface is screen printed and populated with components, and then a customized tooling fixture supports the now populated surface while the other surface of the board is screen printed and populated with components. Even this tooling change reduces the throughput of the fabrication line.

In view of the above-identified problems associated with known tooling fixtures, it is an aim of the present invention to provide a tooling fixture which conforms to the shape of an irregular surface of a workpiece, such as a printed circuit board having components fixed to the lower surface thereof, to be supported without requiring prior configuration or information as to the shape of the surface to be supported.

Accordingly, the present invention provides a tooling fixture for supporting a workpiece, comprising: a body including a surface over which a workpiece is in use supported and a plurality of bores therein; a plurality of supporting elements for supporting the workpiece, each slideably disposed in a respective one of the bores such as to be extendable from the surface of the body; at least one fluid reservoir operably in fluid communication with the supporting elements such as to cause sliding of ones of the supporting elements on displacement of the fluid in the at least one fluid reservoir; and fluid control means for displacing the fluid in the at least one reservoir such as to cause the supporting elements to be extended to a supporting position in contact with the workpiece and locking the supporting elements in the supporting position.

Of one aspect of the present invention a block is provided with a plurality of cylinders. Each cylinder surrounds a piston that drives a rod extending out of the top surface of the block. The cylinders are connected with a pressure sensor and an accumulator. A controllable valve is connected between the accumulator and the cylinders. Opening the valve allows hydraulic fluid to flow between the cylinders and the accumulator. The pressure sensor monitors the hydrostatic pressure of the hydraulic fluid in the cylinders. A compressed air source is connected to the accumulator through a further valve, such that when this valve is opened a force is generated to drive fluid into the cylinders, thereby causing the pistons to extend from the block. Similarly a vacuum source is also connected to the accumulator through a third valve, such that with this valve open and the compressed air valve closed, a vacuum is applied to the accumulator to draw fluid from the cylinders, thereby causing the pistons to retract into the block. The pressure sensor and the valve are connected with a controller that opens and closes the valve in response to a control sequence and the hydrostatic pressure in the cylinders.

The tooling fixture of this aspect conforms to an uneven surface as follows. The controller opens the fluid valve and the vacuum valve to draw fluid from the cylinders causing the pistons to retract the rods into the block. A workpiece is positioned above the fixture. The workpiece can be substantially flat or can have three-dimensional structures fixed thereon. Of one embodiment, the workpiece is a printed circuit that is either populated with components or else unpopulated. The controller closes the vacuum valve and opens the compressed air valve, forcing fluid into the cylinders and raising the rods. When all of the rods have contacted the surface of the workpiece, the pressure of the fluid sensed by the pressure sensor rises. When this pressure reaches a predetermined threshold, the controller closes the fluid valve and the compressed air valve, and the positions of the rods are fixed. Force applied to the top surface of the workpiece, for example by the printhead of a screen printing machine, is opposed by the rods and deflection of the workpiece is prevented.

Of another embodiment of the present invention a tooling fixture module is provided with a plurality of cylinders. Each cylinder surrounds a piston wherein a portion of the piston extends out of the top surface of the module. The cylinders are connected with a fluid reservoir and pressure source. A control valve assembly is connected between the fluid reservoir and the cylinders. Opening the valve permits fluid to flow between the cylinders and the fluid reservoir, providing for raising or lowering the pistons.

The tooling fixture of this aspect conforms to an uneven surface as follows. Pneumatic pressure acts on a main piston, located within a fluid source. The fluid then acts on a control valve while in its open position in order to provide fluid to the cylinders of the module, causing a portion of the pistons to extend out of the module body. A workpiece is positioned above the tooling fixture. The workpiece can be substantially flat or can have three-dimensional structures fixed thereon. This workpiece can be a printed circuit that is either populated with components or else unpopulated. Each piston that makes contact with the workpiece will remain in this contact position while the other pistons continue to extend out of the module. After all of the pistons have made contact with the workpiece, the control valve closes, preventing the fluid from further entering or leaving the cylinders, thus effectively locking the pistons in a fixed position. Force applied to the top surface of the workpiece, for example, by the printhead of a screen printing machine is opposed by each piston, and deflection of the workpiece is prevented. In order to lower the pistons, the control valve opens, allowing the fluid to exit the cylinders through the valve, and the pistons will retract back into the module.

Of another embodiment of the invention, the fluid source can be in the form of a hydraulic tube containing a first main piston therein for forcing fluid towards the control valve and into the cylinders causing the pistons to move upward extending a portion thereof out of the surface of the module.

Of another embodiment of the invention, the hydraulic tube can be replaced with a fluid reservoir.

Of a further embodiment of the invention, a second fluid reservoir is used in conjunction with the first fluid reservoir to force fluid into cylinder sections above the pistons. A second pneumatic pressure source applies pressure directly to the control valve and to the second fluid reservoir simultaneously. Consequently the control valve is opened and allows fluid to flow from the cylinder sections below the pistons into the first fluid reservoir while fluid from the second reservoir is forced into the cylinder sections above the pistons, causing a portion of the pistons to retract into the module. Similarly, a first pneumatic pressure can be applied to the first fluid reservoir in order to force fluid through the control valve and into cylinder sections below the pistons. This will force the fluid contained in the cylinder sections above the pistons back into the second fluid reservoir, thus raising a portion of the pistons out of the module.

Of a further embodiment of the invention the cylinder and piston assemblies are replaced with rod assemblies each containing support rods, integrally connected at their bottom portions by a large singular cavity. Applying a first pneumatic pressure to a main piston within a fluid reservoir will force fluid through a one-way path in a control valve and into the large singular cavity. The fluid in the large singular cavity will force the support rods to extend out of the module until each of the rod makes contact with the workpiece. To retract the support rods, a second pneumatic pressure is applied to the control valve assembly to open a flow path allowing the fluid to flow from the large singular cavity to the fluid reservoir.

Of another embodiment of the invention the control valve is replaced with a permanent aperture between a single reservoir and a large singular cavity below a series of rod assemblies. The single reservoir includes a main piston with a main rod connected thereto it. A first pneumatic pressure source acts on the main rod and main piston to extend the combination towards the fluid within the fluid reservoir, forcing the fluid within the fluid reservoir through the permanent aperture and into the large singular cavity, thus raising the rods. A second pneumatic pressure source acts on the main rod and main piston to retract the combination away from the fluid within the fluid reservoir, drawing the fluid out of the large singular cavity and back into the fluid reservoir, thus retracting the rods. A third pneumatic pressure source acts on a clamp provided to prevent or allow the main piston and main rod combination within the reservoir to move. In effect, when pressure is applied to the clamp, the main rod is disengaged and permitted to move upon application of pressure applied to it from either the first or second pneumatic pressure source.

Preferred embodiments of the present invention will now be described hereinbelow by way of example only with reference to the accompanying drawings, in which:

FIG. 1 schematically illustrates a cross-sectional view of a tooling fixture in accordance with a first embodiment of the present invention.

FIG. 2 schematically illustrates a cross-sectional view of the tooling fixture of FIG. 1 in a first, workpiece-receiving position;

FIG. 3 schematically illustrates a cross-sectional view of the tooling fixture of FIG. 1 in a second, workpiece-engaging position with the supporting rods partly extended;

FIG. 4 schematically illustrates a cross-sectional view of the tooling fixture of FIG. 1 in a third, workpiece-supporting position;

FIG. 5 schematically illustrates a plan view of a tooling fixture in accordance with a second embodiment of the present invention;

FIG. 6 schematically illustrates a plan view of a tooling fixture in accordance with a third embodiment of the present invention;

FIG. 7 schematically illustrates a plan view of a tooling fixture in accordance with a fourth embodiment of the present invention;

FIG. 8 illustrates an exploded perspective view of a tooling fixture module of a tooling fixture in accordance with a fifth embodiment of the present invention;

FIG. 9 schematically illustrates a cross-sectional view of a tooling fixture in accordance with a sixth embodiment of the present invention;

FIG. 10 illustrates a perspective view of one tooling fixture module of the tooling fixture of FIG. 9;

FIG. 11 illustrates a perspective view of one piston assembly of the tooling fixture of FIG. 9;

FIG. 12 illustrates a perspective view of the piston unit of the piston assembly of FIG. 11;

Figure 13:
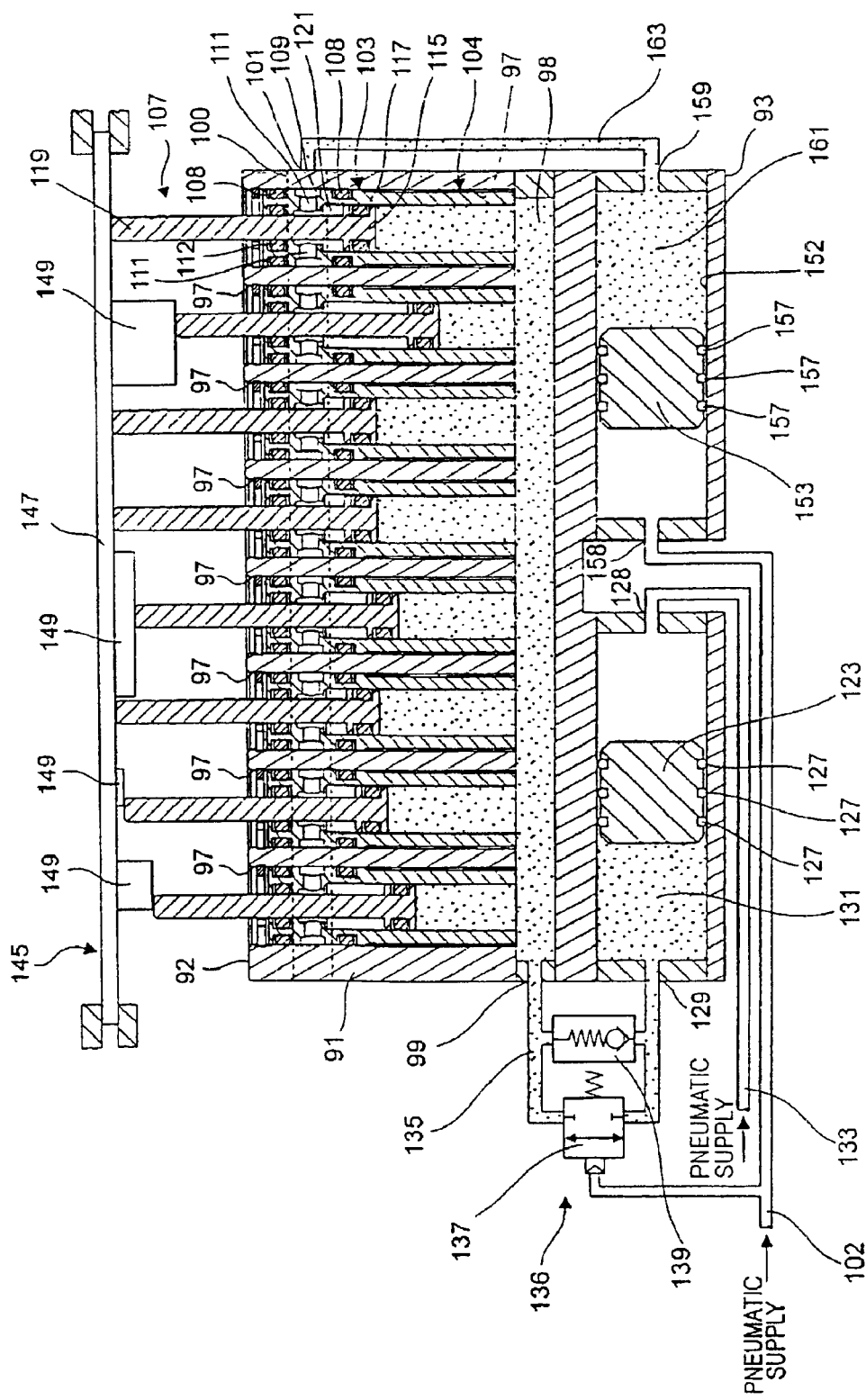
Figure 14:
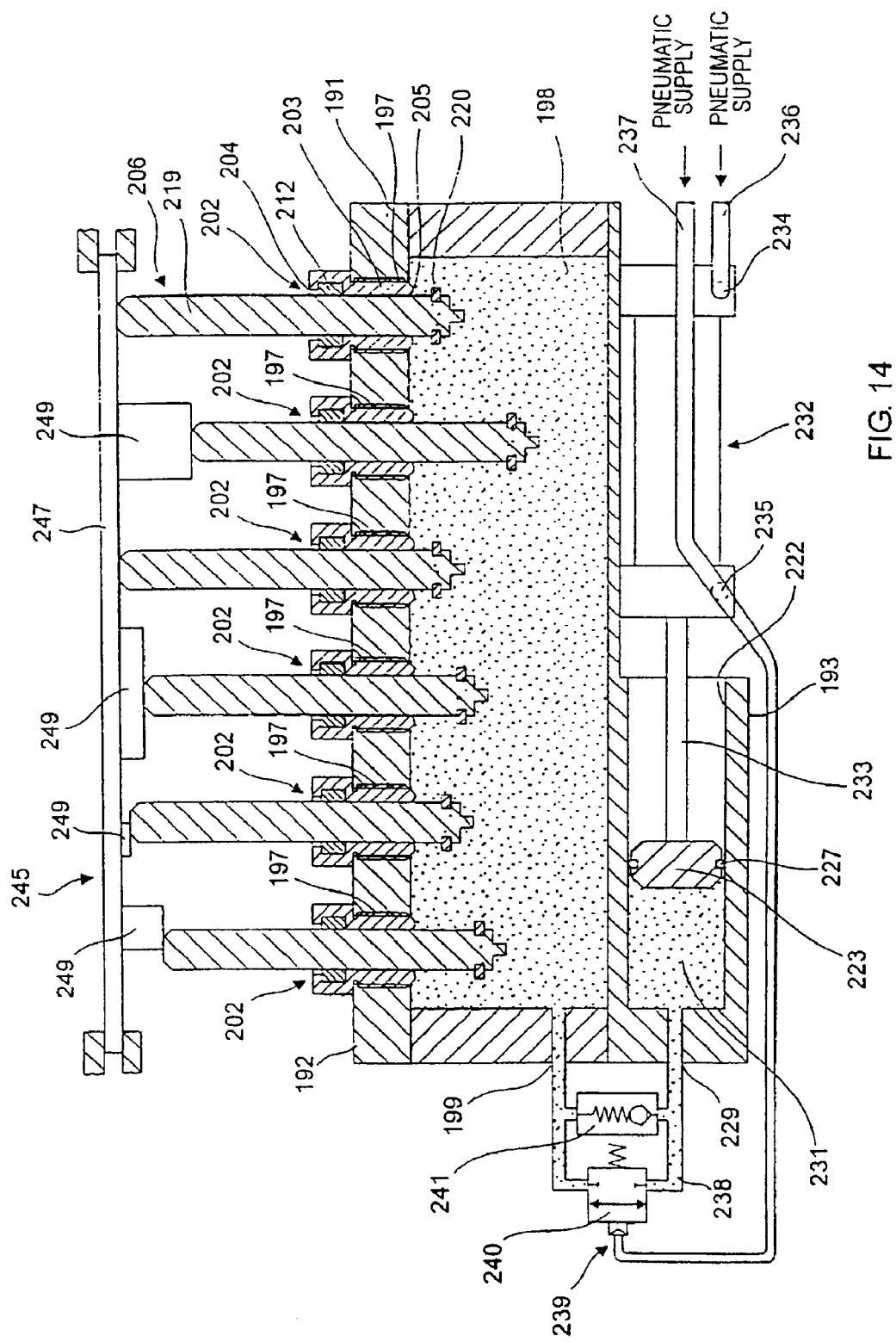
Figure 15:
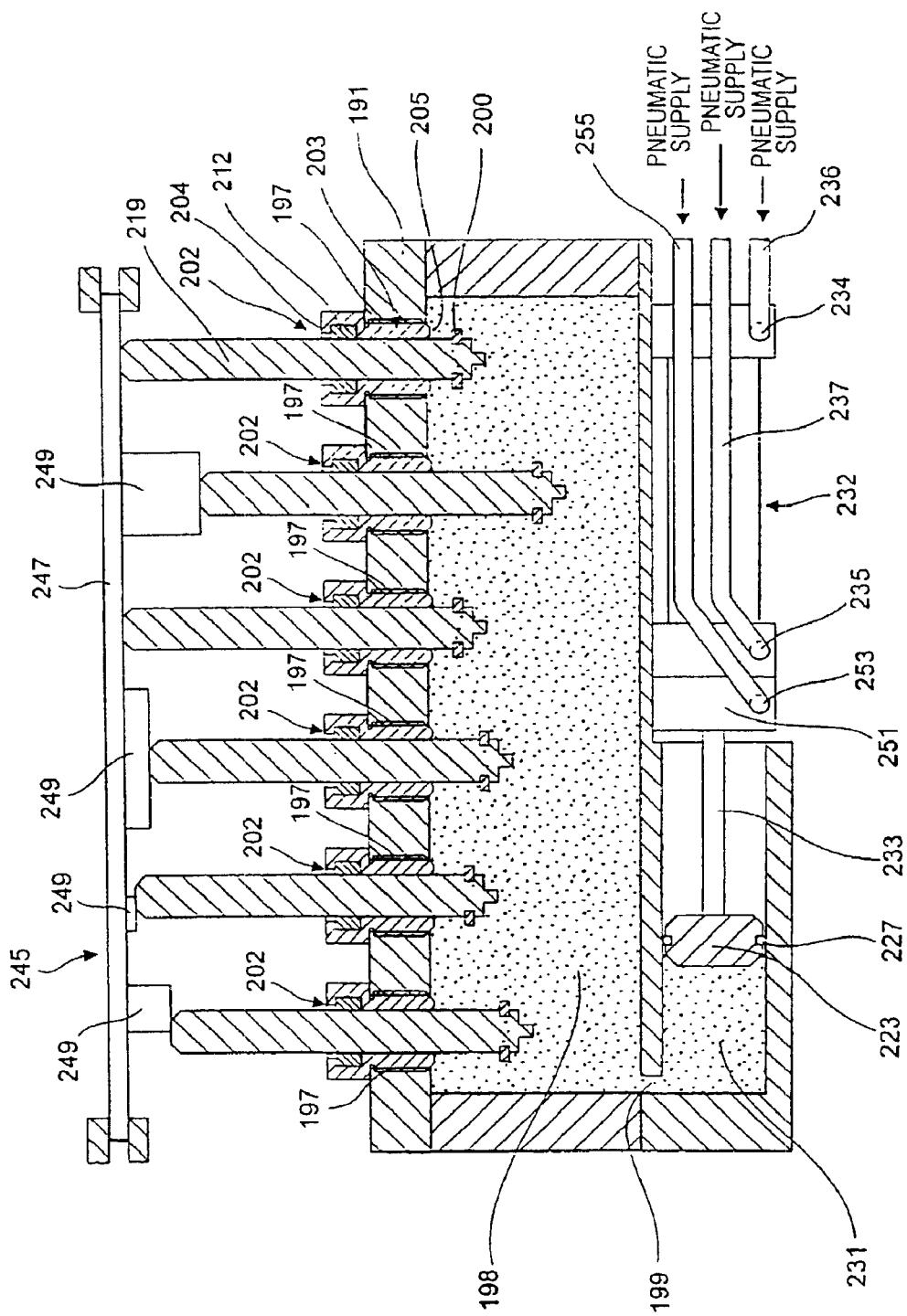
Figure 16:
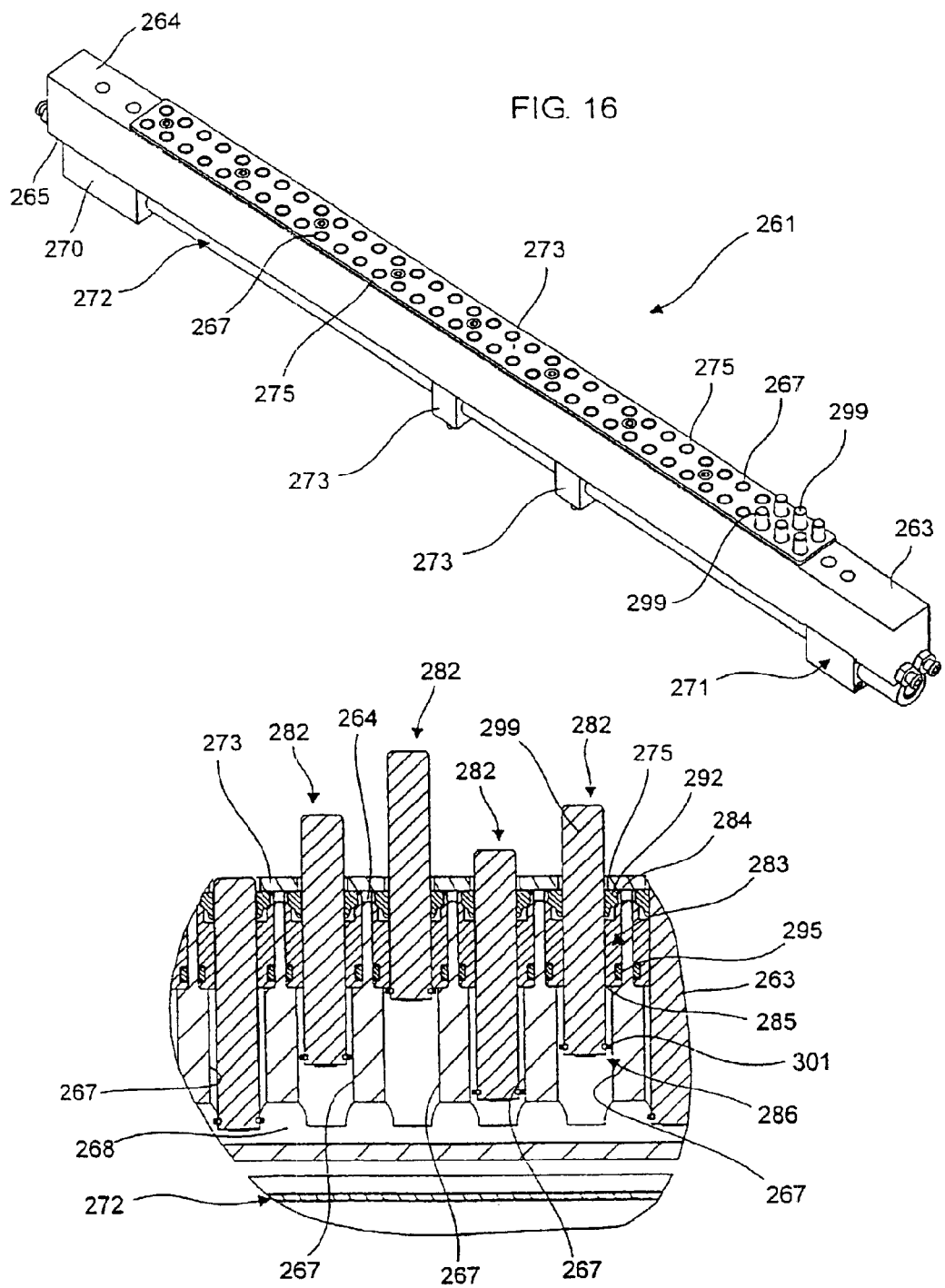
Figure 17:
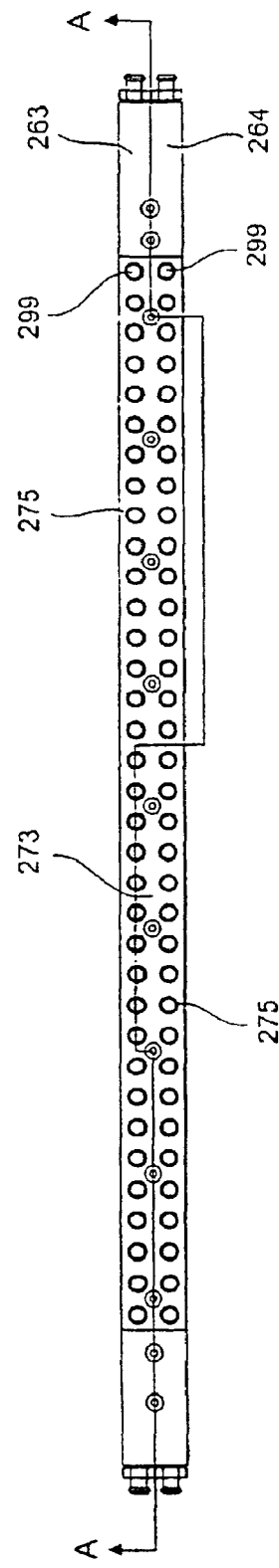
Figure 18:
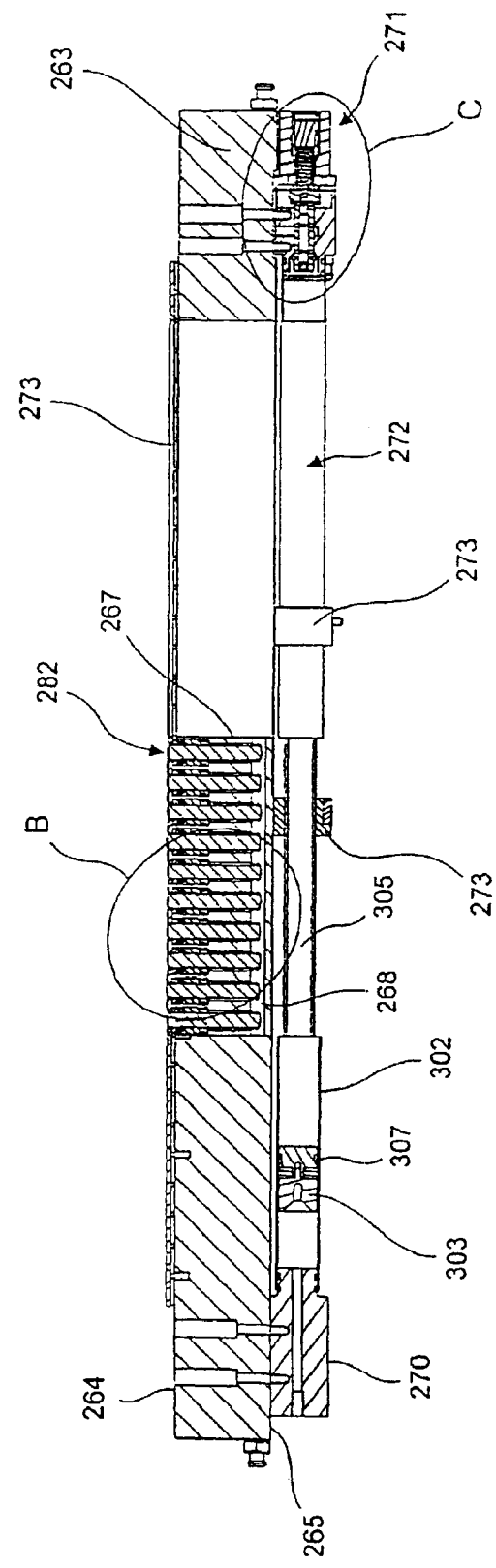
Figure 20:
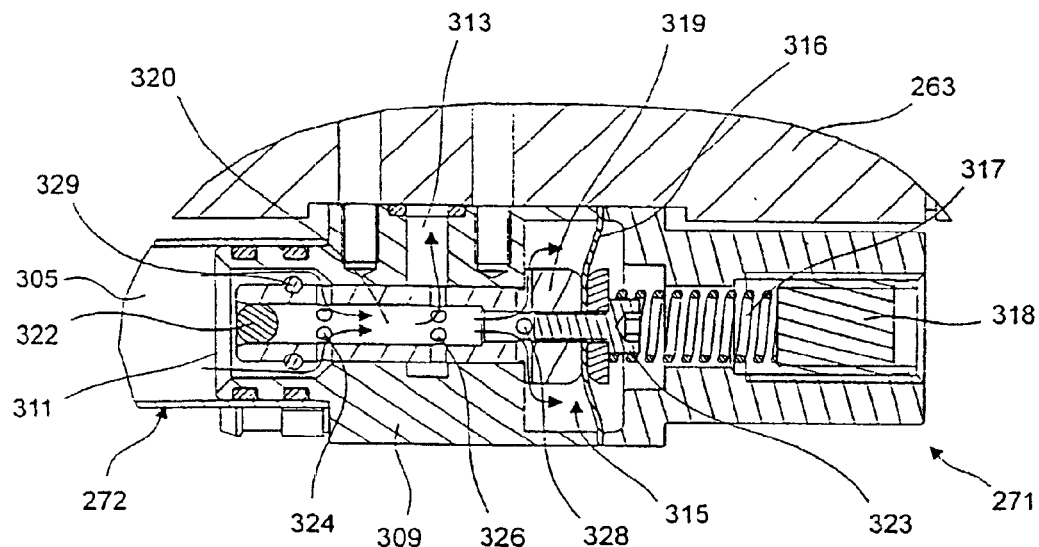
Figure 21:
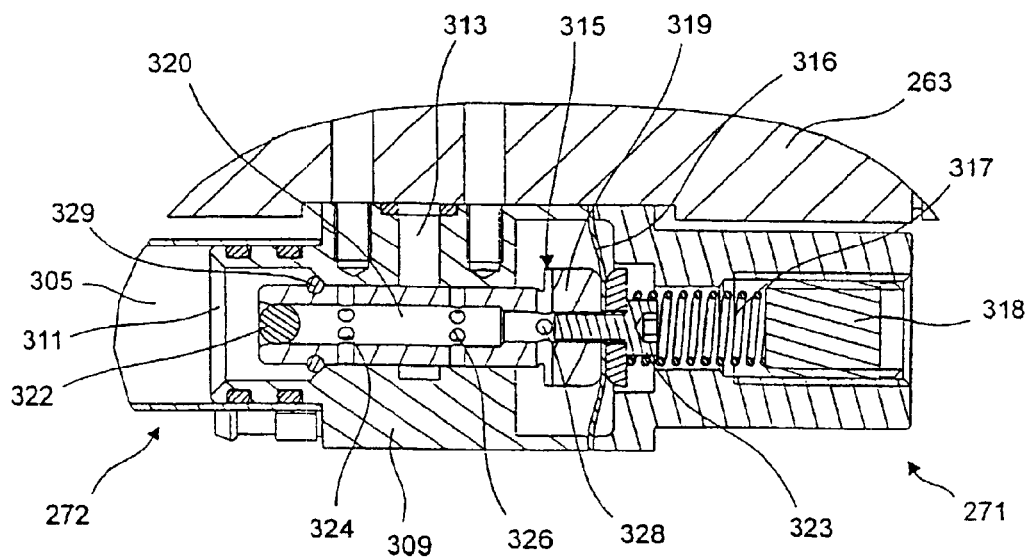
Figure 25:
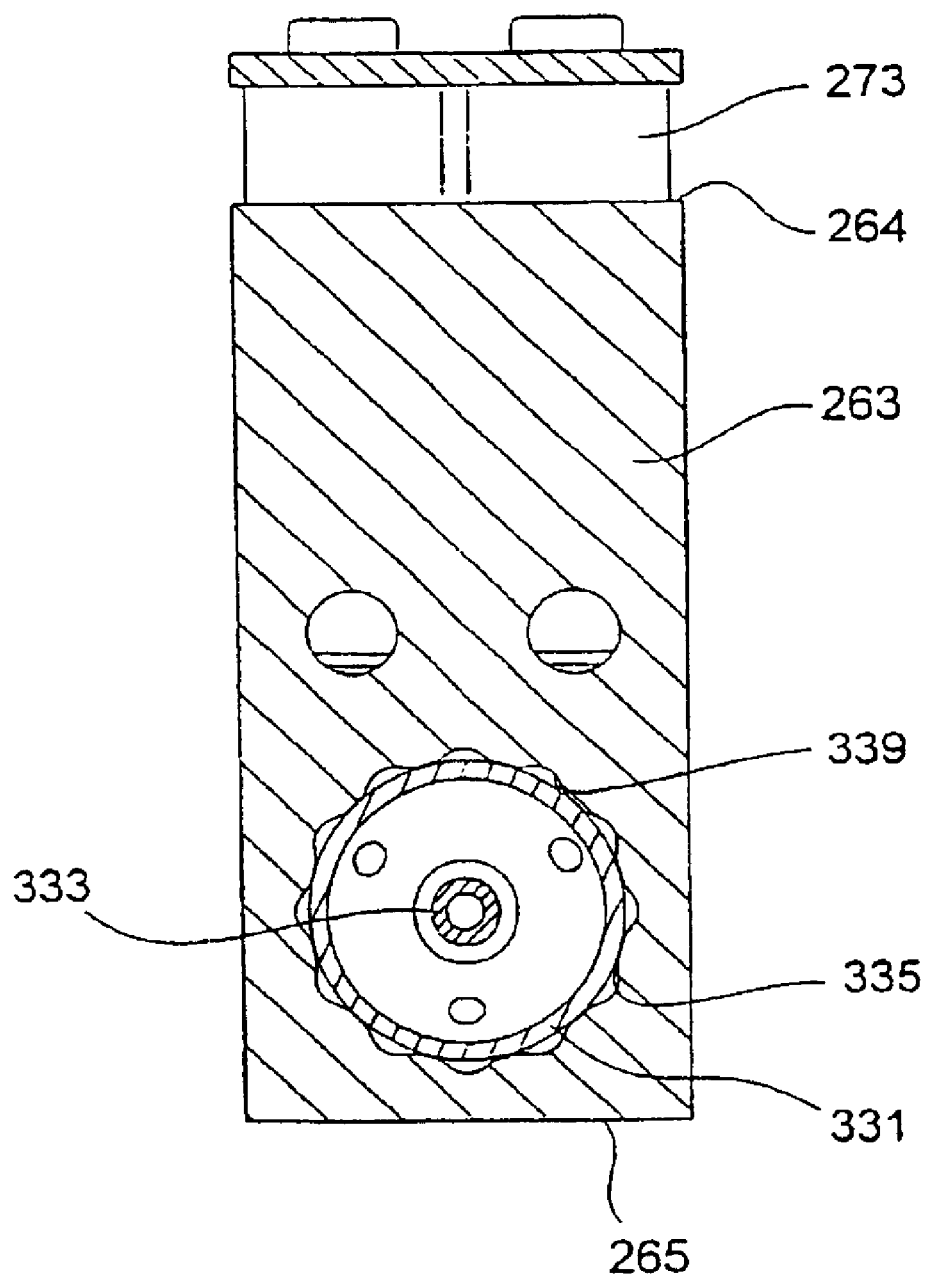

FIG. 13 schematically illustrates a cross-sectional view of a tooling fixture in accordance with a seventh embodiment of the present invention;

FIG. 14 schematically illustrates a cross-sectional view of a tooling fixture in accordance with an eighth embodiment of the present invention;

FIG. 15 schematically illustrates a cross-sectional view of a tooling fixture in accordance with a ninth embodiment of the present invention;

FIG. 16 illustrates a perspective view of a tooling fixture module of a tooling fixture in accordance with a tenth embodiment of the present invention;

FIG. 17 illustrates a plan view of the tooling fixture module of FIG. 16;

FIG. 18 illustrates a cross-sectional view (along section A—A) of the tooling fixture module of FIG. 16;

FIG. 19 illustrates in enlarged scale one part (part B) of the cross-sectional view of FIG. 18;

FIG. 20 illustrates in enlarged scale another part (part C) of the cross-sectional view of FIG. 18, illustrated in a first, open configuration;

FIG. 21 illustrates in enlarged scale the other part (part C) of the cross-sectional view of FIG. 18, illustrated in a second, closed configuration;

FIG. 22 illustrates a cross-sectional view of a tooling fixture module of a tooling fixture in accordance with an eleventh embodiment of the present invention;

FIG. 23 illustrates in enlarged scale one part (part D) of the cross-sectional view of FIG. 22;

FIG. 24 illustrates in enlarged scale another part (part E) of the cross-sectional view of FIG. 22; and FIG. 25 illustrates in enlarged scale a vertical sectional view (along section F—F) of the tooling fixture module of FIG. 22.

FIGS. 1 to 4 illustrate a tooling fixture in accordance with a first embodiment of the present invention.

The tooling fixture comprises a fixture block 3 having upper and lower, in this embodiment substantially parallel, surfaces 4, 5, the upper surface 4 defining a surface over which a workpiece is to be supported and the lower surface 5 being supported on a platform which can be of fixed position or moved vertically so as to raise or lower the fixture block 3. The fixture block 3 includes a plurality of cylinders 7, which in this embodiment extend substantially orthogonally to the upper surface 4 thereof and are arranged as a plurality of parallel rows, and a cavity 9, which acts as a manifold, connecting ones, in this embodiment the lower, ends of the cylinders 7. The fixture block 3 further includes a plurality of apertures 10 in the upper surface 4 thereof corresponding to the respective cylinders 7, and a port 11 in fluid communication with the cavity 9.

The tooling fixture further comprises a plurality of piston units 12 slideably disposed in respective ones of the cylinders 7 such as to be driven on applying a hydraulic pressure into the cavity 9. Each piston assembly 12 comprises a piston 13 which includes an annular seal 14, in this embodiment an O-ring, and is a sealing fit in the respective cylinder 7, and a rod 15 which is connected to the piston 13, with the rod 15 being extended from the upper surface 4 of the fixture block 3 through the respective apertures 10 on introducing hydraulic fluid into the cavity 9 and retracted on withdrawing hydraulic fluid from the cavity 9. Preferably, the annular seal 14 is formed from an elastomeric material, such as buna rubber. In this embodiment each of the rods 15 is provided with an endcap 17. Preferably, the endcaps 17 are formed of a relatively soft material, such as a plastic, so as not to mar the surface of a supported workpiece. Preferably, the endcaps 17 are formed of a material having a high coefficient of friction so as to provide improved grip to a supported workpiece.

The tooling fixture further comprises an accumulator 21 and a supply line 23 connecting a lower region of the accumulator 21 to the port 11 in the fixture block 3. The accumulator 21 holds a sufficient volume of hydraulic fluid as to be able to drive the piston assemblies 12 to the fully extended positions, which extension requires complete filling of the cavity 9 and the cylinders 7 with hydraulic fluid.

The tooling fixture further comprises a pressure sensor 25 and a first valve 27 in the supply line 23, the pressure sensor 25 being provided to detect the hydrostatic pressure of the hydraulic fluid in the cavity 9 and the first valve 27 being provided to selectively connect the cavity 9 and the accumulator 21. In this embodiment the pressure sensor 25 is an electronic sensor which generates a voltage proportional to the detected pressure. In alternative embodiments the pressure sensor 25 could be a pneumatic or mechanical sensor which generates a pneumatic or mechanical signal indicative of the detected pressure. In this embodiment the first valve 27 is an electrically-operated, normally-closed valve. In an alternative embodiment the first valve 27 could be a pneumatic or mechanical valve which is operated in response to a pneumatic or mechanical signal.

The tooling fixture further comprises a second valve 29, in this embodiment a pilot-operated, spring-return two-position valve which includes first, second and third ports 31, 33, 35. The first port 31 of the second valve 29 is connected by a line 30 to an upper region of the accumulator 21. The third port 35 of the second valve 29 is connected by a line 37 to a vacuum source (not illustrated). In the first position of the second valve 29 the first port 31 is connected to the second port 33. In the second position of the second valve 29 the first port 31 is connected to the third port 35 such that the vacuum source is connected to the accumulator 21.

The tooling fixture further comprises a third valve 39, in this embodiment a pilot-operated, spring-return two-position valve which includes first, second and third ports 41, 43, 45. The first port 41 of the third valve 39 is connected by a line 47 to the second port 33 of the second valve 29. The second port 43 of the third valve 39 is connected by a line 49 to atmosphere. The third port 45 of the third valve 39 is connected by a line 51 to a compressed air source (not illustrated). In a first position of the third valve 39 the first port 41 is connected to the second port 43 such that the second port 33 of the second valve 29 is connected to atmosphere, which second valve 29 when in the first position is connected to the accumulator 21. In the second position of the third valve 39 the first port 41 is connected to the third port 45 such that the compressed air source is connected to the second port 33 of the second valve 29, which second valve 29 when in the second position is connected to the accumulator 21.

The tooling fixture further comprises a controller 53 for controlling the operation of the first, second and third valves 27, 29, 39 in response to the pressure signal generated by the pressure sensor 25. Where the tooling fixture is provided as part of a machine, such as a screen printing machine or a placement machine, the controller 53 can be configured either to operate in conjunction with the controller of the machine or be provided as part of the controller of the machine. In this embodiment the controller 53 is a programmable logic controller which executes programmed instructions. In an alternative embodiment the controller 53 could be a programmable computer.

One mode of operation of the tooling fixture will now be described with reference to FIGS. 2 to 4.

Figure 1:
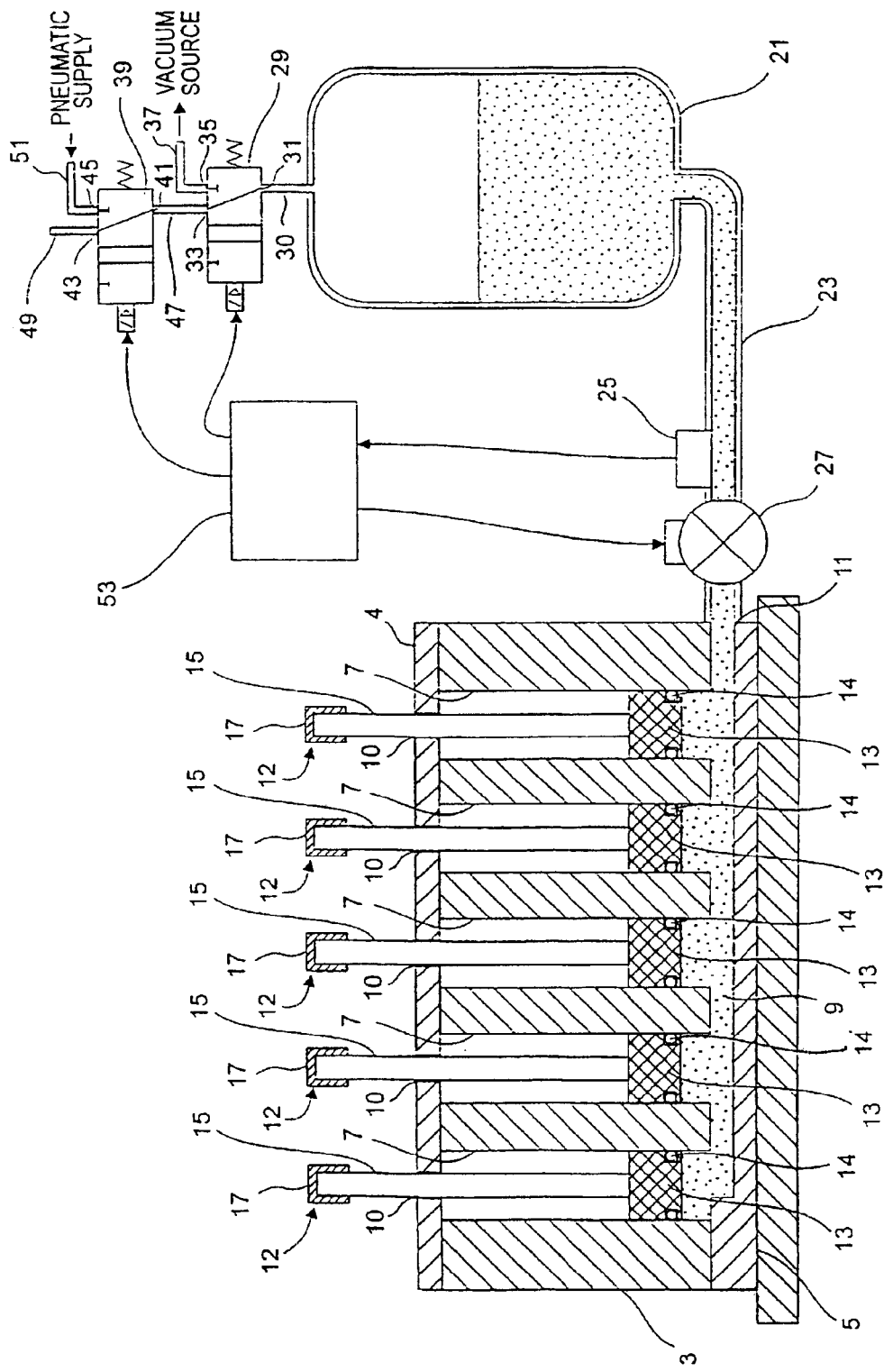
Figure 2:
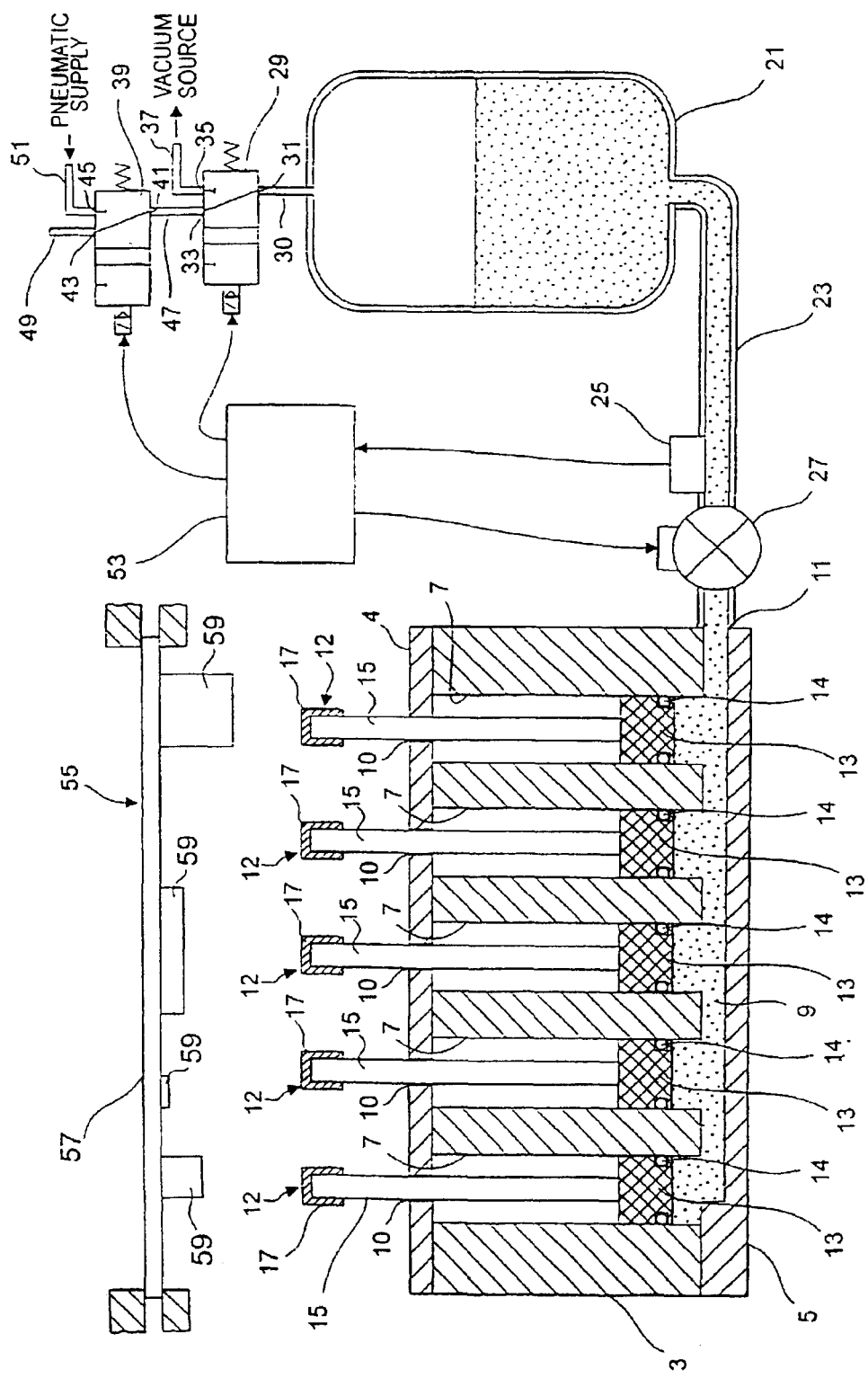

With the piston assemblies 12 in the lowered position, the first valve 27 closed and the second and third valves 29, 39 in the first position, as illustrated in FIG. 2, a workpiece 55 is fixed at a position spaced above the upper surface 4 of the fixture block 3 In this embodiment the workpiece 55 is a printed circuit board 57 having a lower surface populated with electronic components 59.

Under the control of the controller 53, the first valve 27 is opened and the second valve 39 switched to the second position, allowing compressed air to flow into the accumulator 21 and force fluid from the accumulator 21 into the cavity 9. This fluid flow causes the pistons 13 of the piston units 12 to be driven upwards in the respective cylinders 7, thereby causing the rods 15 of the piston units 12 to be extended from the upper surface 4 of the fixture block 3 and approach the populated printed circuit board 57.

Figure 3:
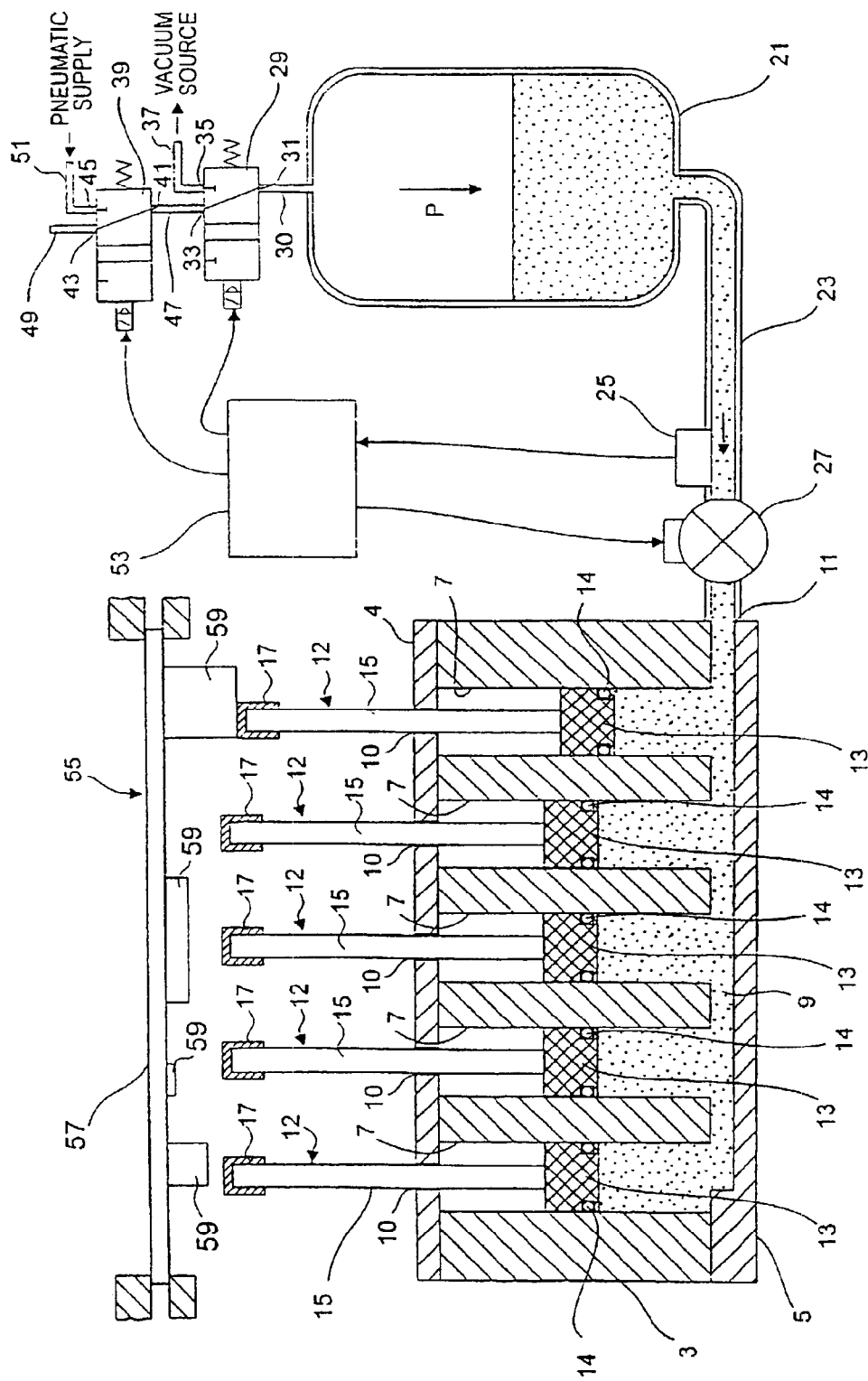
Figure 4:
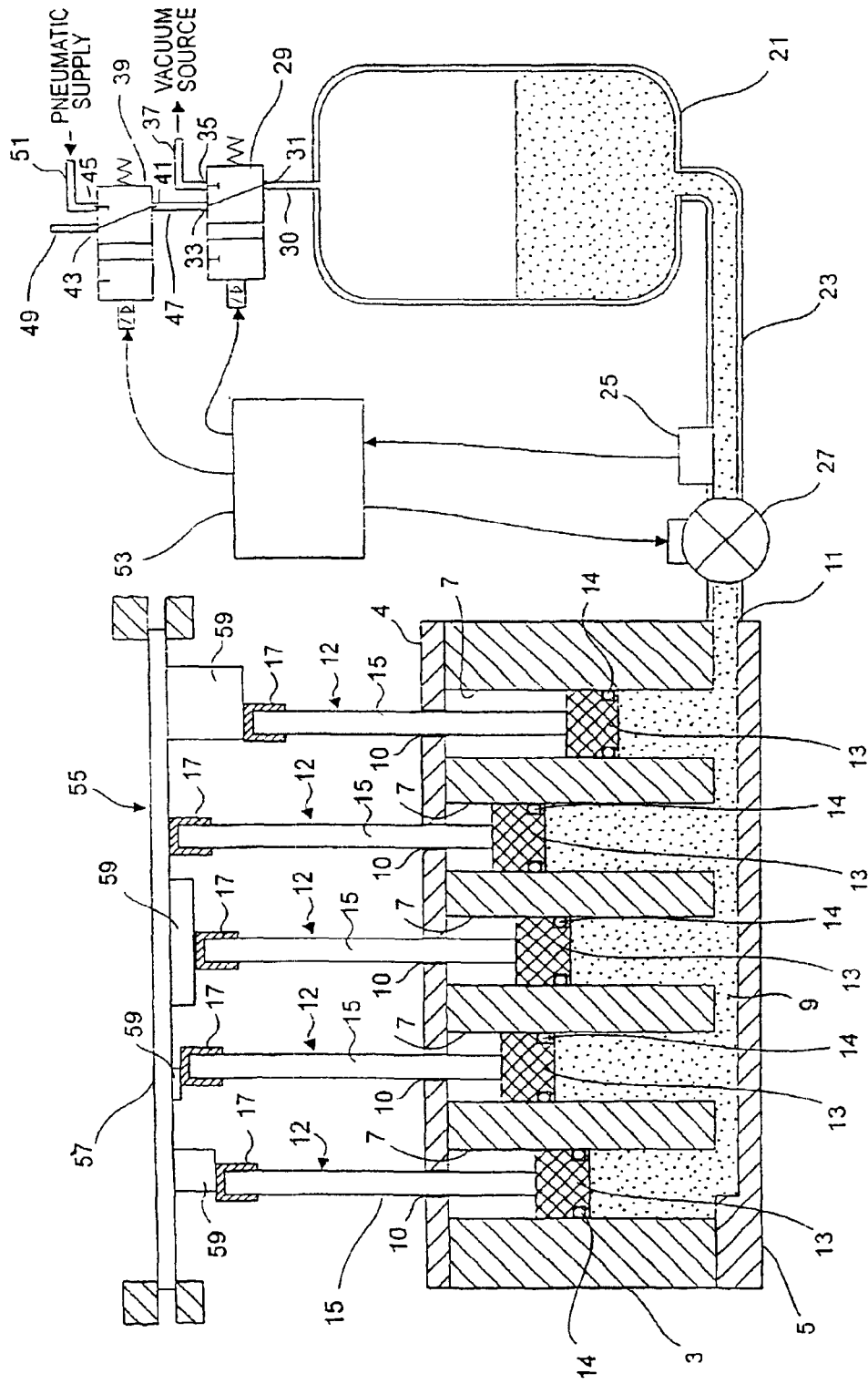

As illustrated in FIG. 3, this driving of the piston units 12 and extension of the rods 15 continues until ones of the rods 15 contact the lower surface of the populated printed circuit board 57. When one of the rods 15, the rightmost in FIG. 4, contacts a component 59 on the lower surface of the printed circuit board 57, that one rod 15 is not extended any further because the reaction of the component 59 on the rod 15 is such as to cause the fluid to flow preferentially into the cylinders 7 housing the other piston units 12 which are free to move and hence offer less resistance to the fluid flow. This filling of selective ones of the cylinders 7 continues as each rod 15 contacts a component 59 or the lower surface of the printed circuit board 57 until such point that each of the rods 15 contacts the workpiece 55, as illustrated in FIG. 4. At that point, fluid flow is prevented and the pressure in the cavity 9 rises rapidly. When a predetermined pressure is detected by the pressure sensor 25, the first valve 27 is closed and the third valve 39 allowed to return to the first position under the control of the controller 53.

In this fully supported position, the upper surface of the printed circuit board 57 can be acted upon, as for example by a printing head of a screen printing machine or in the placement of further components 59 by a placement machine. With the volume of the fluid in the cylinders 7 and the cavity 9 fixed, the workpiece 55 will not flex in response to the application of a force along the row of rods 15 and a force applied locally to the workpiece 55 at a single point will be resisted by the stiffness provided by the viscous flow between the cylinders 7. Where the tooling fixture is used in a screen printing machine, the rows of rods 15 can be aligned with the screen printing head so that the force applied by the printing head along the line of the solder paste is resisted by the rows of rods 15.

When the processing of the workpiece 55 has been completed, under the control of the controller 53, the second valve 29 is switched to the second position and the first valve 27 opened such as to connect the vacuum source to the accumulator 21, whereby fluid is withdrawn from the cavity 9 into the accumulator 21. This withdrawal of fluid from the cavity 9 causes the piston units 12 to be lowered and the rods 15 to be retracted into the fixture block 3. After a predetermined period of time sufficient to allow all of the rods 15 to be fully retracted, the first valve 27 is closed and the second valve 29 allowed to return to the first position. The workpiece 55 can then be removed and the tooling fixture operated again to support another workpiece 55.

Another mode of operation of the tooling fixture will be described hereinbelow.

Under the control of the controller 53, with the platform in the lowered position, the first valve 27 is opened and the third valve 39 switched to the second position such as to allow compressed air to flow into the accumulator 21 and cause the piston units 12 to be driven to the extended position. In allowing compressed air to flow into the accumulator 21, fluid is forced from the accumulator 21 into the cavity 9. This fluid flow causes the pistons 13 of the piston units 12 to be driven upwards in the respective cylinders 7, thereby causing the rods 15 of the piston units 12 to be extended from the upper surface 4 of the fixture block 3. With the rods 15 in the fully extended position, and under the control of the controller 53, the third valve 39 is switched to the first position.

A workpiece 55 is then fixed at a position spaced above the upper surface 4 of the fixture block 3 In this embodiment the workpiece 55 is a printed circuit board 57 having a lower surface populated with electronic components 59.

Under the control of the controller 53, the platform is then raised so that, as each rod 15 contacts a component 59 or the lower surface of the workpiece, those rods 15 push down the pistons 13 into the cylinders 7, displacing fluid from the cavity 9 into the accumulator 21. Back pressure due to viscosity of the fluid maintains the rods 15 in the extended position until engaged by the workpiece 55. When the platform reaches its upper position the controller 53 closes the first valve 27, locking the rods 15 in position.

In this fully supported position, the upper surface of the printed circuit board 57 can be acted upon, as for example by a printing head of a screen printing machine or in the placement of further components 59 by a placement machine.

When the processing of the workpiece 55 has been completed, under the control of the controller 53, the platform is lowered. The workpiece 55 can then be removed and the tooling fixture operated again to support another workpiece 55.

As should be appreciated, the tooling fixture does not require any prior configuration when introducing a different workpiece 55. Rather, the tooling fixture conforms automatically to the lower surface of the workpiece 55 regardless of the position or height of any features on that surface.

In an alternative embodiment the accumulator 21 and the second and third valves 29, 39 could be replaced by a drive piston which is coupled to an actuator and slideably fitted within a master cylinder holding hydraulic fluid. In operation, the actuator raises the drive piston to draw fluid into the master cylinder from the cavity 9 and lowers the drive piston to force fluid from the master cylinder into the cavity 9.

Figure 5:
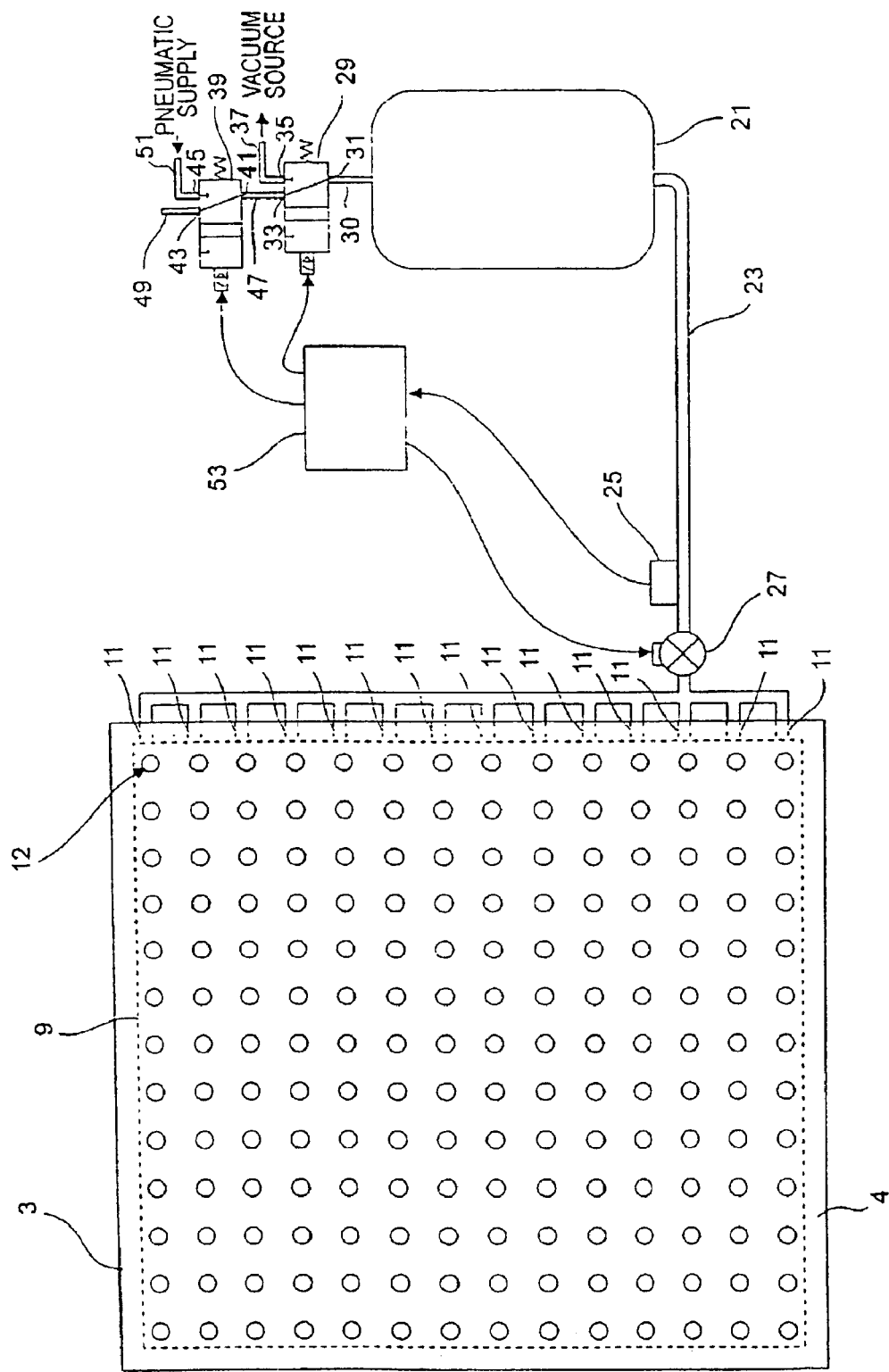

FIG. 5 schematically illustrates a tooling fixture in accordance with a second embodiment of the present invention.

The tooling fixture of this embodiment is quite similar to that of the above-described first embodiment, and thus, in order to avoid unnecessary duplication of description, only the differences will be described in detail, with like parts being designated by like reference signs.

This embodiment differs from that of the above-described first embodiment in that the fixture block 3 includes a plurality of ports 11 associated with respective ones of the rows of cylinders 7.

Operation is the same as for the above-described first embodiment.

Figure 6:
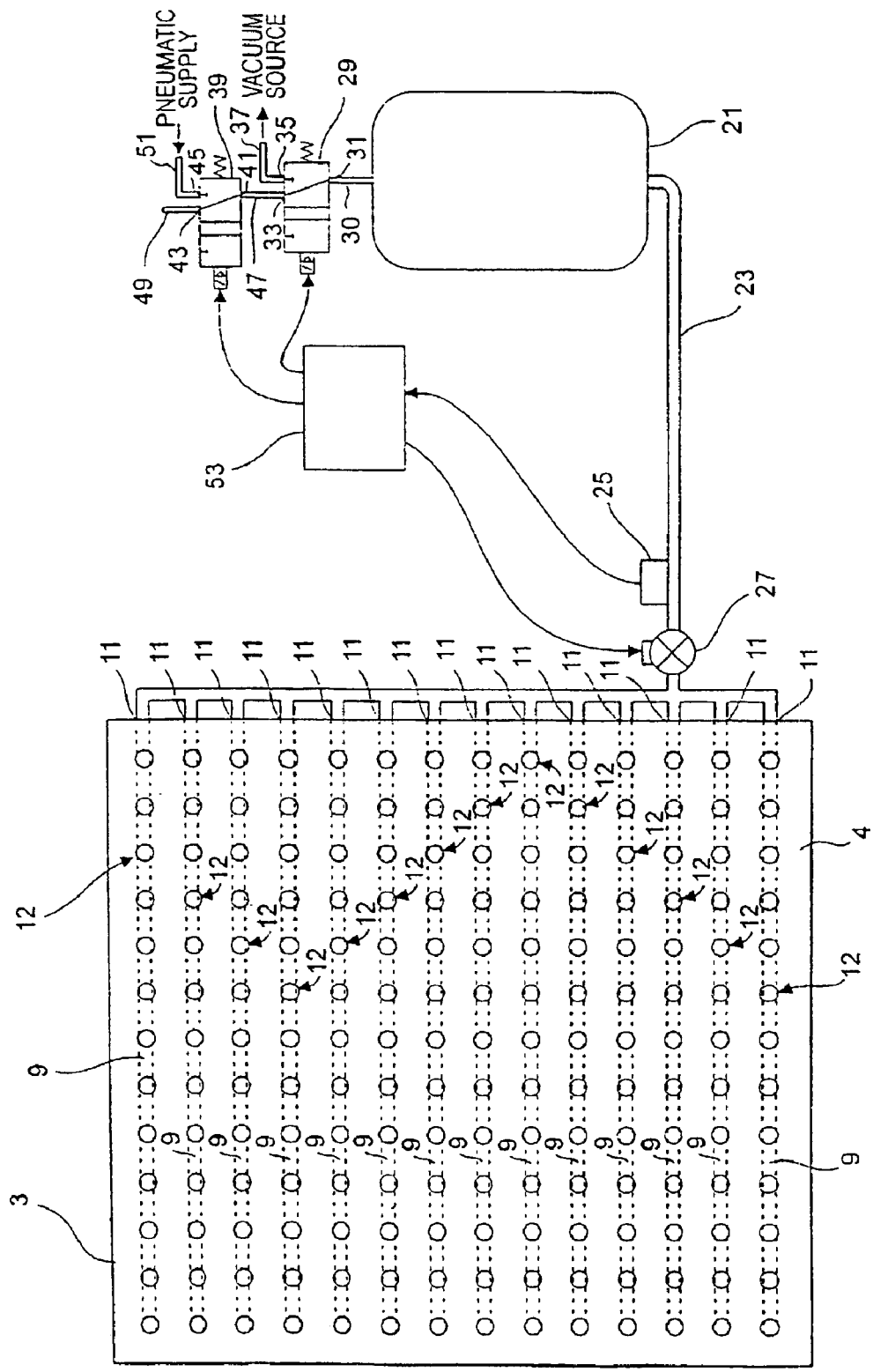

FIG. 6 schematically illustrates a tooling fixture in accordance with a third embodiment of the present invention.

The tooling fixture of this embodiment is quite similar to that of the above-described second embodiment, and thus, in order to avoid unnecessary duplication of description, only the differences will be described in detail, with like parts being designated by like reference signs.

This embodiment differs from that of the above-described second embodiment in that each of the rows of cylinders 7 in the fixture block 3 is connected by a separate manifold cavity 9.

Operation is the same as for the above-described second embodiment.

Figure 7:
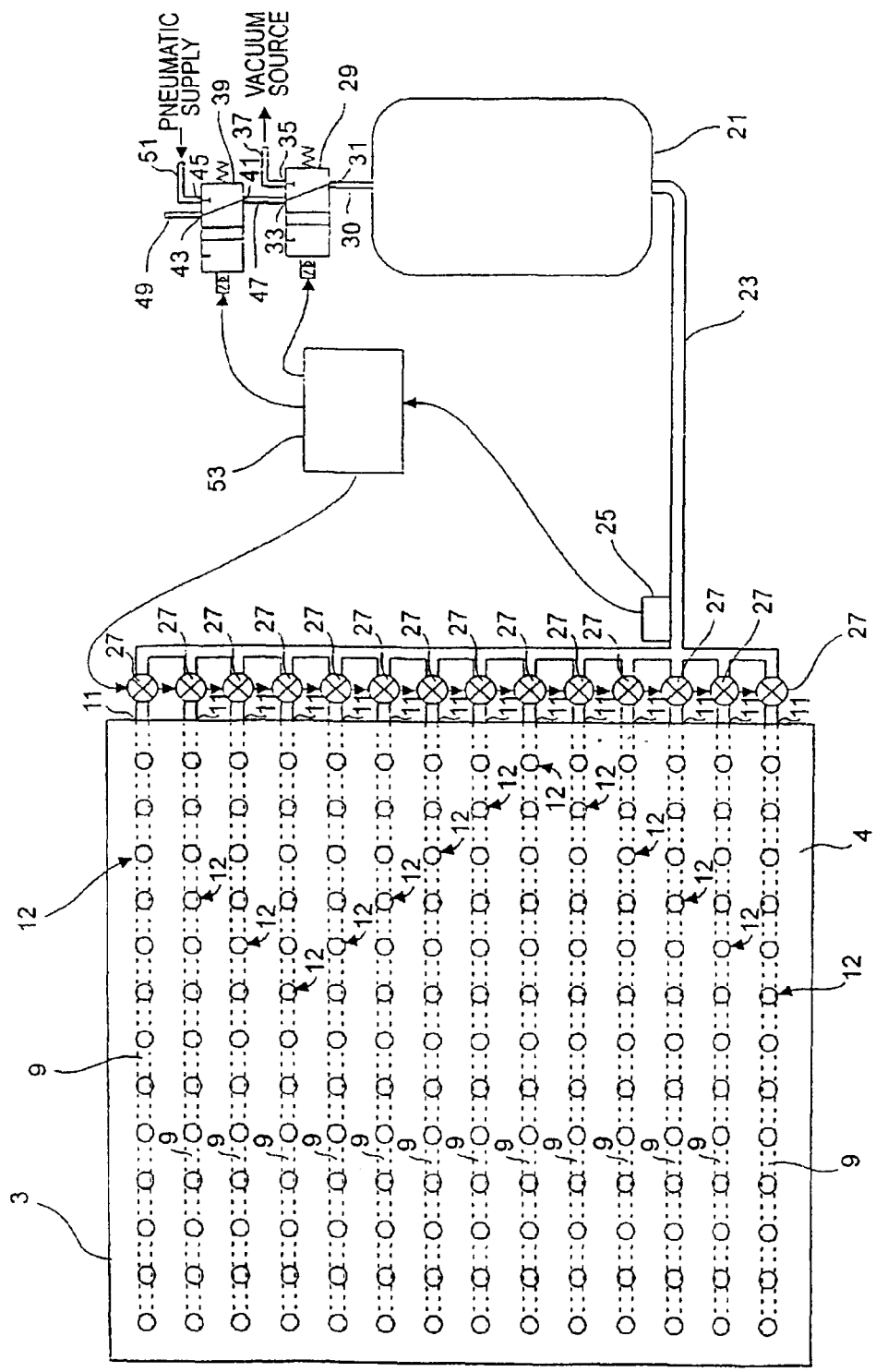

FIG. 7 schematically illustrates a tooling fixture in accordance with a fourth embodiment of the present invention.

The tooling fixture of this embodiment is quite similar to that of the above-described third embodiment, and thus, in order to avoid unnecessary duplication of description, only the differences will be described in detail, with like parts being designated by like reference signs.

This embodiment differs from that of the above-described third embodiment in that each of the separate manifold cavities 9 are connected to the supply line 23 through a separate valve 27.

Operation of this tooling fixture is the same as for the above-described third embodiment, with all of the valves 27 being simultaneously closed when the predetermined pressure is detected by the pressure sensor 25. This embodiment advantageously allows for ones of the rows of cylinders 7 to be isolated from the supply line 23, by maintaining the respective valves 27 closed, where the workpiece 55 does not span those rows of cylinders 7 and hence piston units 12, thereby minimising the necessary transfer of fluid to ensure fully supporting the workpiece 55.

The tooling fixture of this embodiment is particularly applicable where a relatively high force is applied to the workpiece 55 during processing and where a force is applied simultaneously across one row of the rods 15, such as applied by a screen printing head, as the separation of each manifold cavity 9 by the valves 27 prevents fluid transfer to adjacent manifold cavities 9. The tooling fixtures of the second and third embodiments are more suited to applications were relatively a light force is applied to the workpiece 55 for a short period of time, such as exists in placement machines, as under those conditions the inherent stiffness prevents a single rod 15 or group of rods 15 from being depressed.

Figure 8:
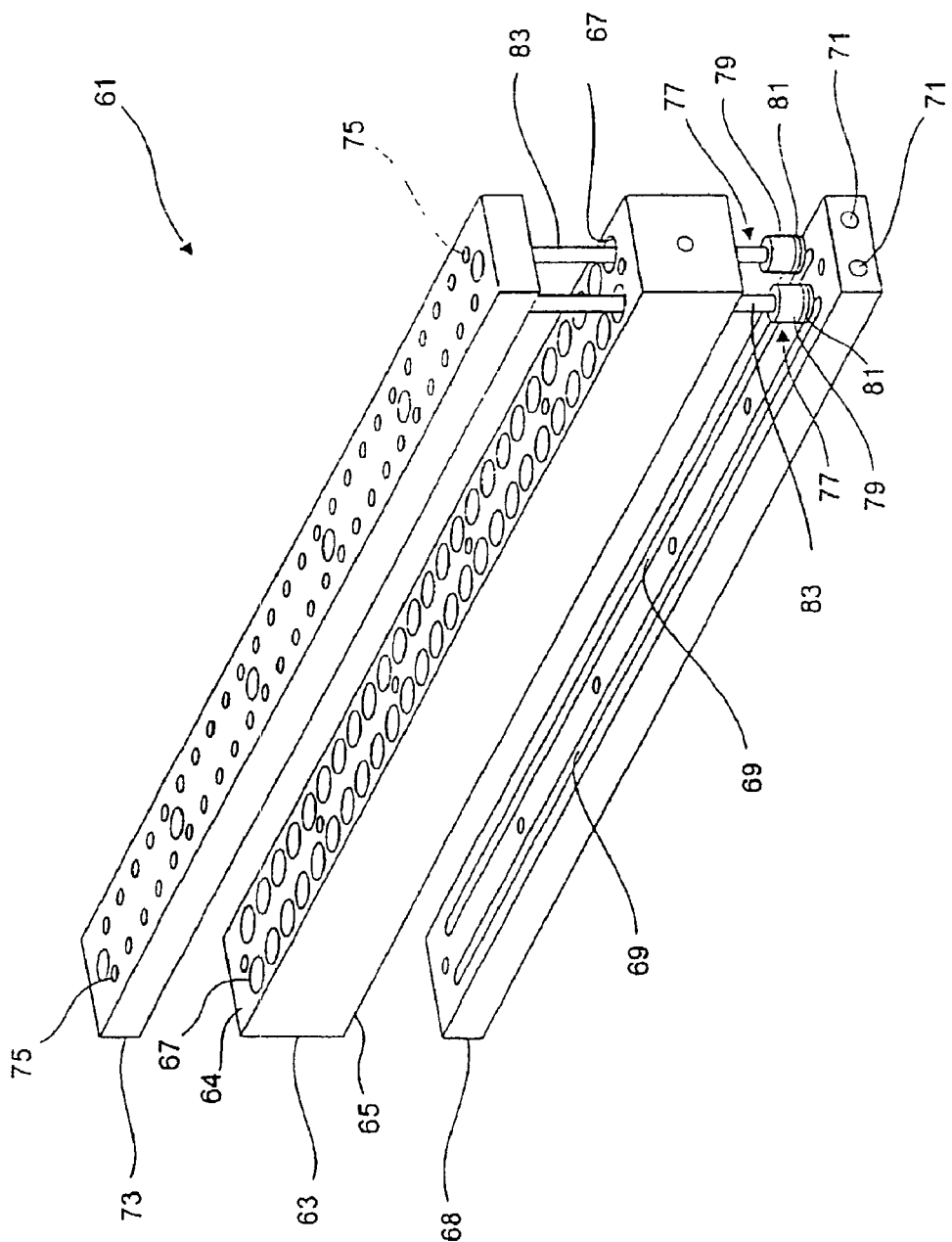

FIG. 8 illustrates one tooling fixture module 61 of a tooling fixture in accordance with a fifth embodiment of the present invention.

In this embodiment the tooling fixture is constructed from a plurality of the tooling fixture modules 61, with the number of tooling fixture modules 61 incorporated being determined by the size of the workpiece to be supported. This tooling fixture module is adapted to be incorporated in the tooling fixture of the above-described third and fourth embodiments.

The tooling fixture module 61 comprises a main body 63, in this embodiment an elongate body, having upper and lower, in this embodiment substantially parallel, surfaces 64, 65, and including first and second rows of cylinders 67 which in this embodiment extend substantially orthogonally to the upper surface 64 thereof.

The tooling fixture module 61 further comprises a first, lower member 68 which is fixed to the lower surface 65 of the main body 63, and includes first and second cavities 69, in this embodiment elongate channels which act as manifolds, connecting ones, in this embodiment the lower, ends of the cylinders 67 in the respective rows of the cylinders 67, and first and second ports 71 in fluid communication with respective ones of the first and second cavities 69. In a preferred embodiment a gasket can be located between the lower member 68 and the main body 63 to ensure a fluid-tight seal.

The tooling fixture module 61 further comprises a second, upper member 73 which is fixed to the upper surface 64 of the main body 63 and includes first and second rows of apertures 75 corresponding to the rows of cylinders 67 in the main body 63.

The tooling fixture module 61 further comprises a plurality of piston units 77 slideably disposed in respective ones of the cylinders 67 such as to be driven on applying a hydraulic pressure in the respective ones of the cavities 69. In the same manner as the above-described embodiments, each piston assembly 77 comprises a piston 79 which includes an annular seal 81, in this embodiment an O-ring, and is a sealing fit in the respective cylinder 67, and a rod 83 which is connected to the piston 79, with the rods 83 being extendable through the upper member 73 on introducing hydraulic fluid into the cavities 69. For clarity of illustration, only two piston units 77 are illustrated.

FIGS. 9 to 12 illustrate a tooling fixture in accordance with a sixth embodiment of the present invention.

The tooling fixture comprises a fixture block 91 having upper and lower, in this embodiment substantially parallel, surfaces 92, 93, the upper surface 92 defining a surface over which a workpiece is to be supported and the lower surface 93 being supported on a platform which can be of fixed position or moved vertically to raise or lower the fixture block 91.

The fixture block 91 includes a plurality of cylinders 97, which in this embodiment extend substantially orthogonally to the upper surface 94 thereof and are arranged in first and second parallel rows, and first and second cavities 98, which act as manifolds and connect ones, in this embodiment the lower ends of the cylinders 97 of the respective ones of the first and second rows of cylinders 97. The fixture block 91 further includes first and second ports 99 in fluid communication with respective ones of the first and second manifold cavities 98, an elongate flow channel 100 extending through an upper region thereof and in fluid communication with each of the cylinders 97, and a third port 101 in communication with the flow channel 100. The third port 101 is connected by a first pneumatic supply line 102 to a first pneumatic supply (not illustrated).

The tooling fixture further comprises a plurality of piston assemblies 103 disposed in respective ones of the cylinders 97. In this embodiment each piston assembly 103 is retained in the respective cylinder 97 by a C-clip. As illustrated in FIGS. 11 and 12, each piston assembly 103 comprises a piston sleeve 104, in this embodiment an elongate, cylindrical tubular element, having openings 105, 106 at the ends thereof, which is a tight fit in the respective cylinder 97, and a piston unit 107 which is slideably disposed within the piston sleeve 104.

The piston sleeve 104 includes first and second spaced annular cylinder seals 108, in this embodiment O-rings, at the upper, outer end thereof to maintain a sealing fit with the respective cylinder 97, and an annular groove 109, which is in fluid communication with the flow channel 100. The piston sleeve 104 further includes first and second apertures 111 in the peripheral wall thereof which provide a fluid communication path between the internal volume thereof and the annular groove 109. The piston sleeve 104 further includes an annular piston rod seal 112 in the inner surface thereof at the same axial position as the first cylinder seal 108 to maintain a sealing fit with the piston unit 107.

The piston unit 107 comprises a piston 115 which includes an annular piston seal 117, in this embodiment an O-ring, and is a sealing fit in the respective piston sleeve 104, and a rod 119 which is connected to the piston 115, with the rod 119 being a sealing fit in the piston rod seal 112 and extendable from the upper surface 92 of the fixture block 91 on introducing hydraulic fluid into the respective manifold cavity 98. With this construction, a chamber 121 is defined within the piston sleeve 104 between the piston rod seal 112 and the piston seal 117, with the apertures 111 serving as inlet or outlet ports.

The fixture block 91 further includes a piston cavity 122, in this embodiment an elongate cavity, and a drive piston 123 which includes annular seals 127, in this embodiment O-rings, and is a sealing fit in the piston cavity 122. The piston cavity 122 includes first and second ports 128, 129 at the opposed ends thereof. The drive piston 123 is slideably disposed in the piston cavity 122 and defines a fluid reservoir 131 containing hydraulic fluid, the volume of which reservoir 131 is sufficient as to be able to drive the piston units 107 to the fully extended positions, which extension requires complete filling of the manifold cavities 98 and the piston sleeves 104, and is controlled by movement of the drive piston 123. The first port 128 of the piston cavity 122 is connected by a second pneumatic supply line 133 to a second pneumatic supply (not illustrated).

The tooling fixture further comprises a fluid supply line 135 connecting the ports 99 of the manifold cavities 98 and the second port 129 of the piston cavity 122, and a valve unit 136 which comprises first and second valves 137, 139, in this embodiment a pilot-operated, spring-return two position valve and a one-way valve respectively, connected in parallel to the fluid supply line 135, with the pilot of the first valve 137 being connected to the first pneumatic supply line 102 and the second valve 139 being configured to allow flow only from the fluid reservoir 131 into the manifold cavities 98. In the first position of the first valve 137, the first valve 137 is closed and flow is possible only via the one-way valve 139. In the second position of the first valve 137, the first valve 137 is open and fluid is able to flow therethrough.

The tooling fixture further comprises a controller (not illustrated) for controlling the operation of the first and second pneumatic supplies. Where the tooling fixture is provided as part of a machine, such as a screen printing machine or a placement machine, the controller can be configured either to operate in conjunction with the controller of the machine or be provided as part of the controller of the machine. In this embodiment the controller is a programmable controller which executes programmed instructions stored in a memory. In an alternative embodiment the controller could be a programmed computer.

Operation of the tooling fixture will now be described hereinbelow.

With the piston units 107 in the lowered position, a workpiece 145 is fixed at a position spaced above the upper surface 92 of the fixture block 91. In this embodiment the workpiece 145 is a printed circuit board 147 having a lower surface populated with electronic components 149.

With the first pneumatic supply de-actuated and the first valve 137 in the first position, the drive piston 123 is driven by applying a predetermined pneumatic pressure through the second pneumatic supply line 133. This pneumatic pressure causes the drive piston 123 to be moved forwardly and the hydraulic fluid in the reservoir 131 to be forced via the second valve 139 through the fluid supply line 135 and into the manifold cavities 98 and the piston sleeves 104. This fluid flow causes the pistons 115 of the piston units 107 to be driven upwards in the respective piston sleeves 104, thereby causing the rods 119 of the piston units 107 to be extended from the upper surface 92 of the fixture block 91 and approach the populated printed circuit board 147.

Figure 9:
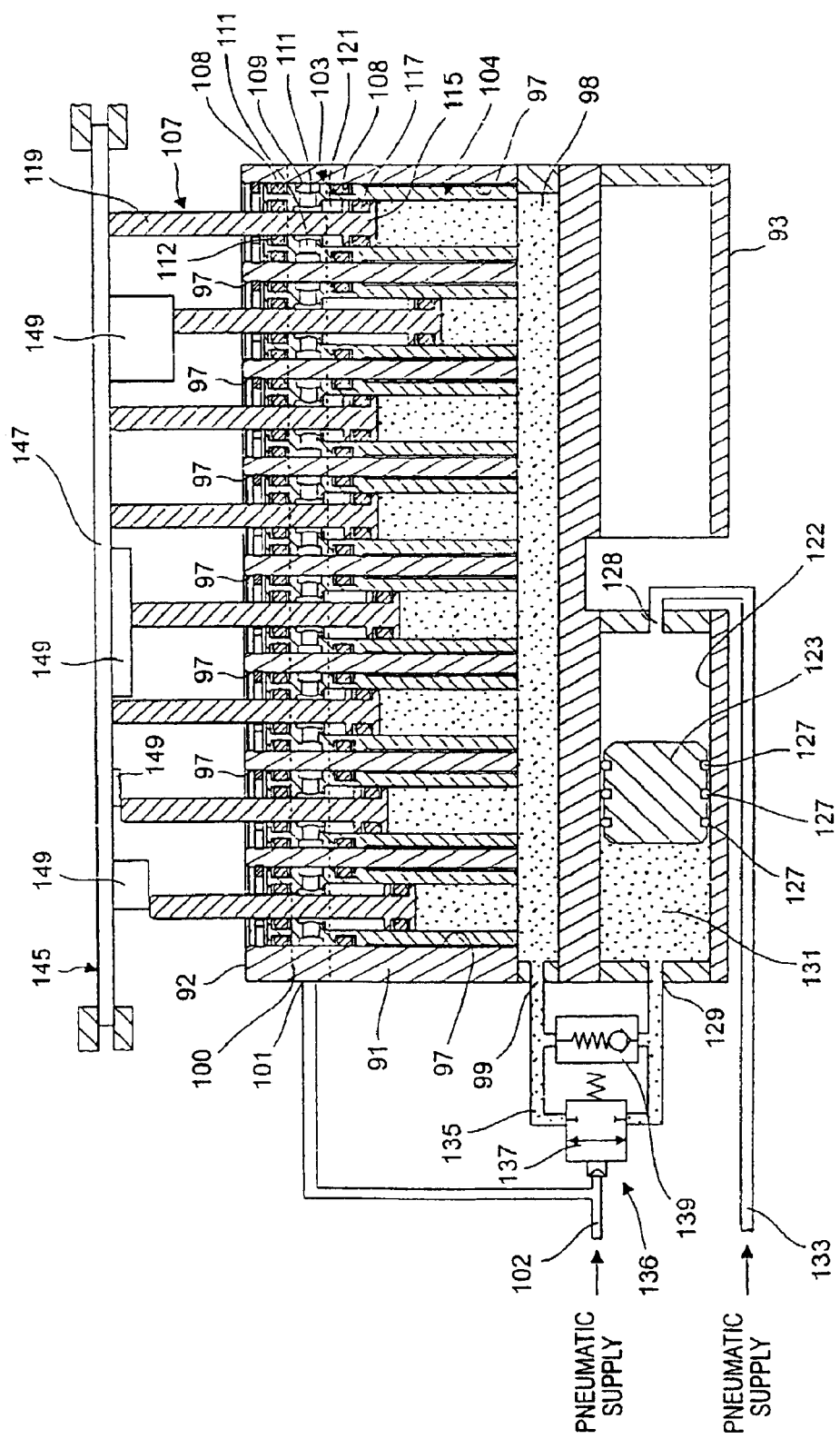

This driving of the piston units 107 and extension of the rods 119 continues as ones of the rods 119 contact the lower surface of the populated printed current board 147. When ones of the rods 119 contact a component 149 on the lower surface of the printed circuit board 147, that one rod 119 is not extended any further because the reaction of the component 149 on the rod 119 is such as to cause the fluid to flow preferentially into the piston sleeves 104 housing the other piston units 107 which are free to move and hence offer less resistance to the fluid flow. This filling of selective ones of the piston sleeves 104 continues as each rod 119 contacts a component 149 or the lower surface of the printed circuit board 147 until such point that all of the rods 119 contact the workpiece 145, as illustrated in FIG. 9. At that point, the pressure in the manifold cavities 98 rises rapidly. When the pressure in the manifold cavities 98 reaches the predetermined pressure of the first pneumatic supply, movement of the drive piston 123 ceases as the pressures on the opposed driving faces of the drive piston 123 are equal. At this point the first pneumatic supply can be de-actuated, with fluid flow from the manifold cavities 98 being prevented by the second valve 139.

In this fully supported position, the upper surface of the printed circuit board 147 can be acted upon, as for example by a printing head of a screen printing machine or in the placement of further components by a placement machine. With the volume of the fluid in the piston sleeves 104 and the manifold cavities 98 fixed, the workpiece 145 will not flex in response to the application of a force along the row of rods 119 and a force applied locally to the workpiece 145 at a single point will be resisted by the stiffness provided by the viscous flow between the piston sleeves 104. Where the tooling fixture is used in a screen printing machine, the rows of rods 119 can be aligned with the screen printing head so that the force applied by the printing head along the line of the solder paste is resisted by the rows of rods 119.

When the processing of the workpiece 145 has been completed, under the control of the controller, a pneumatic pressure is introduced into the first pneumatic supply line 102, which pressure switches the first valve 137 to the second position, thereby allowing fluid flow through the first valve 137 from the manifold cavities 98, and causes the piston units 107 to be driven downwards to the retracted position by the action of the pneumatic pressure acting in the chambers 121 in the piston assemblies 103. As the piston units 107 are driven to the retracted position, fluid is transferred from the manifold cavities 98 to the reservoir 131, which fluid transfer causes the drive piston 123 to be moved rearwardly to the original position. After a predetermined period of time sufficient to allow all the piston units 107 to be fully retracted, the pneumatic pressure in the first pneumatic supply line 102 is de-actuated, thereby allowing the first valve 137 to return to the first position. The workpiece 145 can then be removed and the tooling fixture operated again to support another workpiece 145.

FIG. 13 schematically illustrates a tooling fixture in accordance with a seventh embodiment of the present invention.

The tooling fixture of this embodiment is quite similar to that of the above-described sixth embodiment, and thus, in order to avoid unnecessary duplication of description, only the differences will be described in detail, with like parts being designated by like reference signs. This embodiment differs from that of the above-described sixth embodiment in the manner in which the piston units 107 are returned to the retracted position.

This embodiment differs from the above-described sixth embodiment in that the fixture block 91 further includes a second piston cavity 152, in this embodiment an elongate cavity, and a second drive piston 153 which includes annular seals 157, in this embodiment O-rings, and is a sealing fit in the second piston cavity 152. The second piston cavity 152 includes first and second ports 158, 159 at the opposed ends thereof. The second drive piston 153 is slideably disposed in the piston cavity 152 and defines a second fluid reservoir 161 containing hydraulic fluid, the volume of which reservoir 161 is sufficient as to be able to drive the piston units 107 to the fully retracted positions, which retraction requires complete filling of the return chambers 121 in the piston assemblies 103, and is controlled by movement of the second drive piston 153.

This embodiment further differs from the above-described sixth embodiment in that the first pneumatic supply line 102 is connected not to the pilot of the first valve 137 and the port 101 in communication with the flow channel 100, but rather the pilot of the first valve 137 and the first port 158 of the second piston cavity 152.

This embodiment further differs from the above-described sixth embodiment in including a second fluid supply line 163 connecting the second port 159 of the second piston cavity 152 to the port 101 of the flow channel 100.

Operation of this tooling fixture is essentially the same as that of the above-described sixth embodiment, but instead of the piston units 107 being returned by the delivery of the second pneumatic pressure directly into the return chambers 121 in the piston assemblies 103, the second pneumatic pressure acts on the second drive piston 153 to force fluid from the second fluid reservoir 161 into the return chambers 121 in the piston assemblies 103.

FIG. 14 illustrates a tooling fixture in accordance with an eighth embodiment of the present invention.

The tooling fixture comprises a fixture block 191 having upper and lower, in this embodiment substantially parallel, surfaces 192, 193, the upper surface 192 defining a surface over which a workpiece is to be supported and the lower surface 193 being supported on a platform which can be of fixed position or moved vertically to raise or lower the fixture block 191.

The fixture block 191 includes a plurality of bores 197, which in this embodiment extend substantially orthogonally to the upper surface 192 thereof and are arranged as a plurality of parallel rows, and a cavity 198, which acts as a manifold and connects ones, in this embodiment the lower, ends of the bores 197. The fixture block 191 further includes a port 199 in fluid communication with the manifold cavity 198.

The tooling fixture further comprises a plurality of piston assemblies 202 disposed in respective ones of the bores 197. In this embodiment each piston assembly 202 is retained in the respective bore 197. Each piston assembly 202 comprises a piston sleeve 203, in this embodiment a cylindrical tubular element having openings 204, 205 at the ends thereof, which is an interference fit in the respective bore 197, and a piston unit 206 which is slideably disposed within the piston sleeve 203.

The piston sleeve 203 includes an annular rod seal 212, in this embodiment an O-ring, at the upper, inner end thereof to maintain a sealing fit with the piston unit 206.

The piston unit 206 comprises a rod 219 which is a sealing fit in the piston rod seal 212 and extendable from the upper surface 192 of the fixture block 191 on introducing fluid into the manifold cavity 198. The piston rod 219 includes a stop 220, in this embodiment a C-clip, at the lower end thereof to prevent the rod 219 from being driven out of the piston sleeve 203 on introducing fluid into the manifold cavity 198.

The fixture block 191 further includes a piston cavity 222, in this embodiment an elongate cavity, one end of which is closed and the other end of which is open, and a drive piston 223 which includes an annular seal 227, in this embodiment an O-ring, and is a sealing fit in the piston cavity 222. The piston cavity 222 includes a port 229 in the closed end thereof. The drive piston 223 is slideably disposed in the piston cavity 222 and defines a fluid reservoir 231 containing hydraulic fluid, the volume of which reservoir 231 is sufficient as to be able to drive the piston rods 219 to the fully extended positions, which extension requires complete filling of the manifold cavity 198, and is controlled by movement of the drive piston 223.

The tooling fixture further comprises a pneumatic actuator 232 which includes a drive rod 233 connected to the drive piston 223 for driving the drive piston 223 on actuation thereof. In this embodiment the pneumatic actuator 232 includes first and second ports 234, 235 connected respectively to first and second pneumatic supply lines 236, 237 to which pneumatic supplies (not illustrated) are connected to extend and retract the drive rod 233 respectively.

The tooling fixture further comprises a fluid supply line 238 connecting the port 199 of the manifold cavity 198 and the port 229 of the piston cavity 222, and a valve unit 239 which comprises first and second valves 240, 241, in this embodiment a pilot-operated, spring-return two position valve and a one-way valve respectively, connected in parallel in the fluid supply line 238, with the pilot of the first valve 240 being connected to the second pneumatic supply line 237 and the second valve 241 being configured to allow flow only from the reservoir 231 into the manifold cavity 198. In the first position of the first valve 240, the first valve 240 is closed and flow is possible only via the one-way valve 241. In the second position of the first valve 240, the first valve 240 is open and fluid is able to flow therethrough.

The tooling fixture further comprises a controller (not illustrated) for controlling the operation of the first and second pneumatic supplies. Where the tooling fixture is provided as part of a machine, such as a screen printing machine or a placement machine, the controller can be configured either to operate in conjunction with the controller of the machine or be provided as part of the controller of the machine. In this embodiment the controller is a programmable controller which executes programmed instructions stored in a memory. In an alternative embodiment the controller could be a programmed computer.

Operation of the tooling fixture will now be described hereinbelow.

With the piston units 206 in the lowered, retracted position, a workpiece 245 is fixed at a position spaced above the upper surface 192 of the fixture block 191. In this embodiment the workpiece 245 is a printed circuit board 247 having a lower surface populated with electronic components 249.

With the second pneumatic supply de-actuated and the first valve 240 in the first position, the drive piston 223 is driven by applying a predetermined pneumatic pressure to the first pneumatic supply line 236. This pneumatic pressure actuates the pneumatic actuator 232 and causes the drive piston 223 to be moved forwardly and the fluid in the reservoir 231 to be forced via the second valve 241 through the fluid supply line 238 and into the manifold cavity 198. This fluid flow causes the piston units 206 to be driven upwards in the respective piston sleeves 203, thereby causing the rods 219 of the piston units 206 to be extended from the upper surface 192 of the fixture block 191 and approach the populated printed circuit board 247.

This driving of the piston units 206 and extension of the rods 219 continues as ones of the rods 219 contact the lower surface of the populated printed circuit board 247. When ones of the rods 219 contact a component 249 on the lower surface of the printed circuit board 247, that one rod 219 is not extended any further because the reaction of the component 249 on the rod 219 is such as to cause the other piston units 206 to move which offer less resistance to the fluid flow. This filling of the manifold cavity 198 continues as each rod 219 contacts a component 249 or the lower surface of the printed circuit board 247 until such point that all of the rods 219 contact the workpiece 245, as illustrated in FIG. 14. At that point, the pressure in the manifold cavity 198 rises rapidly. When the pressure in the manifold cavity 198 reaches the predetermined pressure of the first pneumatic supply, movement of the drive piston 223 ceases as the pressures on the opposed driving faces of the drive piston 223 are equal. At this point, the first pneumatic supply can be de-actuated, with fluid flow from the manifold cavity 198 being prevented by the second valve 241.

In this fully supported position, the upper surface of the workpiece 245 can be acted upon, as for example by a printing head of a screen printing machine or in the placement of further components by a placement machine. With the volume of the fluid in the manifold cavity 198 fixed, the workpiece 245 will not flex in response to the application of a force along the row of rods 219 and a force applied locally to the workpiece 245 at a single point will be resisted by the stiffness provided by the viscous flow in the manifold cavity 198. Where the tooling fixture is used in a screen printing machine, the rows of rods 219 can be aligned with the screen printing head so that the force applied by the printing head along the line of the solder paste is resisted by the rows of rods 219.

When the processing of the workpiece 245 has been completed, under the control of the controller, a pneumatic pressure is introduced into the second pneumatic supply line 237, which pressure switches the first valve 240 to the second position, thereby allowing fluid flow through the first valve 240 from the manifold cavity 198, and causes the drive piston 223 to be driven rearwardly by the pneumatic actuator 232 which causes fluid flow from the manifold cavity 198 into the reservoir 231 and in turn causes the piston units 206 to be driven downwards to the retracted positions. After a predetermined period of time sufficient to allow all of the piston units 206 to be fully retracted, the pneumatic pressure in the second pneumatic supply line 237 is de-actuated, thereby allowing the first valve 240 to return to the first position. The workpiece 245 can then be removed and the tooling fixture operated again to support another workpiece 245.

FIG. 15 schematically illustrates a tooling fixture in accordance with a ninth embodiment of the present invention.

The tooling fixture of this embodiment is quite similar to that of the above-described eighth embodiment, and thus, in order to avoid unnecessary duplication of description, only the differences will be described in detail, with like parts being designated by like reference signs. This embodiment differs from that of the above-described eighth embodiment in the manner of the connection between the manifold cavity 198 and the fluid reservoir 231.

This embodiment differs from the above-described eighth embodiment in that the valve unit 239 is omitted and that the manifold cavity 231 is connected directly to the reservoir 231. In this embodiment the port 199 to the manifold cavity 198 is provided as an aperture between the manifold cavity 198 and the reservoir 231.

This embodiment further differs from the above-described eighth embodiment in that the pneumatic actuator 232 includes a clamp 251 for locking the position of the drive rod 233 and hence the drive piston 223 such as to fix the volume of fluid in the manifold cavity 198. In this embodiment the clamp 251 is a pneumatically-operated clamp which normally locks the drive rod 233 and is released on the application of a pneumatic pressure. The clamp 251 includes a port 253 connected to a third pneumatic supply line 255 to which is connected a third pneumatic supply (not illustrated).

Operation of this tooling fixture is essentially the same as that of the above-described eighth embodiment, but instead of fluid flow from the manifold cavity 198 being prevented by a check valve, the drive piston 223 is physically locked by the clamp 251, with the clamp 251 being released by actuating the third pneumatic supply when movement of the drive piston 223 is required.

FIGS. 16 to 21 illustrate one tooling fixture module 261 of a tooling fixture in accordance with a tenth embodiment of the present invention.

In this embodiment the tooling fixture is constructed from a plurality of the tooling fixture modules 261, with the number of tooling fixture modules 261 incorporated being determined by the size of the workpiece to be supported.

The tooling fixture module 261 comprises a main body 263, in this embodiment an elongate body, having upper and lower, in this embodiment substantially parallel, surfaces 264, 265. The main body 263 includes a plurality of cylinders 267, which in this embodiment extend substantially orthogonally to the upper surface 264 thereof and are arranged in first and second parallel rows, and first and second cavities 268, which act as manifolds and connect ones, in this embodiment the lower, ends of the cylinders 267 of the respective ones of the first and second rows of cylinders 267. The main body 263 further includes first and second ports in fluid communication with respective ones of the first and second manifold cavities 268.

The tooling fixture module 261 further comprises a connector block 270 and a valve unit 271 fixed to the lower surface 265 of the main body 263 at the opposed ends thereof, a fluid drive unit 272, in this embodiment formed as an elongate section extending between the connector block 270 and the valve unit 271, and first and second mounting blocks 273 fixed to the lower surface 265 of the main body 263 at positions between the connector block 270 and the valve unit 271.

The tooling fixture module 261 further comprises an upper member 273, in this embodiment a plate, which is fixed to the upper surface 264 of the main body 263 and includes first and second rows of apertures 275 corresponding to the rows of cylinders 267 in the main body 263.

The tooling fixture module 261 further comprises a plurality of piston assemblies 282 disposed in respective ones of the cylinders 267. In this embodiment each piston assembly 282 is retained in the respective cylinder 267. Each piston assembly 282 comprises a piston sleeve 283, in this embodiment a cylindrical tubular element, having openings 284, 285 at the ends thereof, which is an interference fit in the respective cylinder 267, and a piston unit 286 which is slideably disposed within the piston sleeve 283.

The piston sleeve 283 includes an annular rod seal 292, in this embodiment an O-ring, at the upper, inner end thereof to maintain a sealing fit with the piston unit 286, and an annular cylinder seal 295, in this embodiment an O-ring, at the lower, outer end thereof to maintain a sealing fit with the respective cylinder 267.

The piston unit 286 comprises a rod 299 which is a sealing fit in the piston rod seal 292 and extendable from the upper surface 264 of the main body 263 on introducing hydraulic fluid into the manifold cavities 268. The piston rod 299 includes a stop 301, in this embodiment a C-clip, at the lower end thereof to prevent the rod 299 from being driven out of the piston sleeve 283 on introducing fluid into the manifold cavities 268.

The fluid drive unit 272 includes a piston cavity 302, in this embodiment an elongate cavity, and a drive piston 303 which includes an annular seal 307, in this embodiment an O-ring, and is a sealing fit in the piston cavity 302. The piston cavity 302 is connected at one, rearward end to the connector block 270 and at the other, forward end to the valve unit 271. The drive piston 303 is slideably disposed in the piston cavity 302 and defines a fluid reservoir 305 containing hydraulic fluid, the volume of which reservoir 305 is sufficient as to be able to drive the piston units 282 to the fully extended positions, which extension requires complete filling of the manifold cavities 268 and the cylinders 267, and is controlled by movement of the drive piston 303.

As illustrated in FIGS. 20 and 21, the valve unit 271 comprises a main body 309, in this embodiment an elongate body, having a first port 311 at one end thereof in sealed connection with the fluid reservoir 305 and a second port 313 in the peripheral wall thereof in sealed connection with the manifold cavities 268, a piston unit 315 slideably disposed in the main body 309 between a first, open position (as illustrated in FIG. 20) in which a fluid communication path is provided between the first and second ports 311, 313 and a second, closed position (as illustrated in FIG. 21) in which no fluid communication path is provided between the first and second ports 311, 313, and a diaphragm seal 316 sealingly connecting the main body 309 and the piston unit 315 to prevent fluid flow therebeyond. The valve unit 271 further comprises a biasing element 317, in this embodiment a compression spring, which biases the piston unit 315 to the open position, and a screw adjuster 318 to allow adjustment of the biasing force of the biasing element 317. Pretensioning the biasing element 317 advantageously provides that, when the force required to start compressing the biasing element 317 has been exceeded, very little extra force is required to compress the biasing element 317.

The piston unit 315 comprises a piston 319 which includes a hollow bore 320 extending axially therethrough, one end of which is sealed by a rigid ball 322 press-fitted into the bore 320 and the other end of which is closed by a screw 323 attaching the flexible diaphragm 316. The piston 319 includes first, second and third groups of cross-drilled holes 324, 326 and 328 which provide a fluid flow path through the hollow bore 320 of the piston 317 to the manifold cavities 268. The piston unit 315 further includes an annular piston seal 329, in this embodiment an O-ring, at the outer surface of the one end of the piston 319 to provide a tight seal between the piston unit 315 and the main body 309 when the piston unit 315 is in the closed position. In this embodiment the piston seal 329 engages an inwardly tapering surface of the main body 309 such as to provide a particularly tight seal and ensure closure of the manifold cavities 268 for as long as the pneumatic supply is maintained to the drive piston 319.

The tooling fixture further comprises a controller (not illustrated) for controlling the operation of the pneumatic supply and vacuum source. Where the tooling fixture is provided as part of a machine, such as a screen printing machine or a placement machine, the controller can be configured either to operate in conjunction with the controller of the machine or be provided as part of the controller of the machine. In this embodiment the controller is a programmable controller which executes programmed instructions stored in a memory. In an alternative embodiment the controller could be a programmed computer.

Operation of the tooling fixture is described hereinbelow.

With the piston units 286 in the lowered position, a workpiece (not illustrated) is fixed at a position spaced above the tooling fixture. Typically, the workpiece can be a printed circuit board having a lower surface populated with electronic components.

The pneumatic supply is then actuated to drive the drive piston 303 forwardly, which movement of the drive piston 303 causes fluid in the reservoir 305 to flow through the first group of apertures 324 in the piston 319, into the hollow body 320 of the piston 319, through the second group of apertures 326 in the piston 319 and into the manifold cavities 268. This fluid flow causes the piston units 286 to be driven upwards in the respective piston sleeves 283, thereby causing the rods 299 of the piston units 286 to be extended and approach the workpiece.

This driving of the piston units 286 and extension of the rods 299 continues as ones of the rods 299 contact the lower surface of the workpiece. When ones of the rods 299 contact the lower surface of the workpiece, that one rod 299 is not extended any further because the reaction of the workpiece on the rod 299 is such as to cause the other piston units 286 to be moved which offer less resistance to the fluid flow. This filling of the manifold cavities 268 continues as each rod 299 contacts the lower surface of the workpiece until such point that all of the rods 299 contact the workpiece. At that point, the pressure in the manifold cavities 268 and the reservoir 305 rises rapidly. When the pressure reaches a predetermined pressure which is sufficient to overcome the biasing force of the biasing element 317, with the fluid acting on the one end of the piston 319 and through the third group of apertures 328 on the flexible diaphragm 316, the piston unit 315 is moved to the closed position, thereby closing the fluid communication path between the reservoir 305 and the manifold cavities 268 and fixing the volume of fluid in the manifold cavities 268, that the fluid pressure applied to the rods 150 to raise them is limited by the force applied by spring 240, which can be set by selecting a suitable spring and by adjustment of screw 250.

In this fully supported position, the upper surface of the workpiece can be acted upon, as for example by a printing head of a screen printing machine or in the placement of further components by a placement machine. With the volume of the fluid in the manifold cavities 268 fixed, the workpiece will not flex in response to the application of a force along each row of rods 299 and a force applied locally to the workpiece at a single point will be resisted by the stiffness provided by the viscous flow in the manifold cavities 268. Where the tooling fixture is used in a screen printing machine, the rows of rods 299 can be aligned with the screen printing head so that the force applied by the printing head along the line of the solder paste is resisted by the rows of rods 299.

When the processing of the workpiece has been completed, under the control of the controller, the pneumatic supply is de-actuated, causing the biasing element 317 to return the piston unit 315 to the open position. A vacuum source (not illustrated) is then applied to the piston cavity 302 to draw the drive piston 303 rearwardly to the original position, which movement of the drive piston 303 causes fluid flow from the manifold cavities 268 into the reservoir 305 and in turn causes the piston units 286 to be driven downwards to the retracted position. After a predetermined period of time sufficient to allow all the piston units 286 to be fully retracted, the vacuum source can be de-actuated. The workpiece can then be removed and the tooling fixture operated again to support another workpiece.

FIGS. 22 to 25 illustrate a tooling fixture module of a tooling fixture in accordance with an eleventh embodiment of the present invention.

The tooling fixture of this embodiment is quite similar to that of the above-described tenth embodiment, and thus, in order to avoid unnecessary duplication of description, only the differences will be described in detail, with like parts being designated by like reference signs. This embodiment differs from that of the above-described tenth embodiment principally in the construction of the fluid drive unit 272.

This embodiment differs from the above-described tenth embodiment in that the fluid drive unit 272 does not include a drive piston 303, but rather an inflatable bladder 331, the internal volume of which defines the fluid reservoir 305. In this embodiment the bladder 331 is an elongate bladder located about a hollow shaft 333 in an elongate cavity 335 in the main body 263. The hollow shaft 333 includes a plurality of apertures 337 along the length thereof and defines the principal flow path from the reservoir 305 to the valve unit 271. As illustrated in FIG. 25, the cavity 335 includes a plurality of flutes 339 in the surface thereof which act to channel pressure or vacuum applied to the bladder 331.

This embodiment also differs in that the valve unit 271 includes a flow control element 341 to control the flow of fluid from the reservoir 305 through the valve unit 271, but provide substantially unimpeded flow in the opposite direction. In this embodiment the flow control element 341 comprises an annulus of resilient material mounted such that flow from the reservoir 305 is through only the central aperture and flow into the reservoir 305 is through the central aperture and around the periphery thereof, the periphery being deflected by fluid flow into the reservoir 305.

Operation of this tooling fixture is essentially the same as that of the above-described tenth embodiment, but instead of fluid flow being driven by a drive piston, the fluid flow is driven by collapsing or inflating the bladder 331.

Finally, it will be understood that the present invention has been described in its preferred embodiments and can be modified in many different ways without departing from the scope of the inventions as defined by the appended claims.

What is claimed is:

1. A method of supporting workpieces, lower surfaces of ones of which have features of different heights, the method comprising the steps of:

providing a tooling fixture, comprising a body including a plurality of cylinder bores, at least one support fluid manifold fluidly connected to the cylinder bores, and a surface over which a workpiece is in use supported, a plurality of supporting elements for supporting the workpiece, the supporting elements being slideably disposed in respective ones of the cylinder bores, and at least one support fluid reservoir containing support fluid and operably fluidly connected to the at least one support fluid manifold;

displacing support fluid between the at least one support fluid reservoir and the at least one support fluid manifold such that the supporting elements adopt a supporting position in conforming contact with a lower surface of the workpiece, with at least ones of the supporting elements being moved such that at least ones of the supporting elements, from a position not in conforming contact with the lower surface of the workpiece, assume the supporting position in conforming contact with the lower surface of the workpiece in which ones of the supporting elements assume different heights from others of the supporting elements in conformance with features on the lower surface of the workpiece; and locking the supporting elements when in the supporting position.

2. The method of claim 1, wherein the support fluid displacement step comprises the step of:

displacing support fluid from the at least one support fluid reservoir to the at least one support fluid manifold such that the supporting elements are extended to adopt the supporting position in conforming contact with the workpiece, with at least ones of the supporting elements being raised to different heights in conformance with features on the lower surface of the workpiece.

3. The method of claim 1, wherein the support fluid displacement step comprises the steps of:

displacing support fluid from the at least one support fluid reservoir to the at least one support fluid manifold such that the supporting elements are extended to an extended position; and subsequently allowing displacement of support fluid from the at least one support fluid manifold to the at least one support fluid reservoir such that at least ones of the supporting elements are lowered to adopt the supporting position in conforming contact with the workpiece, with at least ones of the supporting elements being lowered to different heights in conformance with features on the lower surface of the workpiece.

4. The method of claim 1, wherein displacement of support fluid from the at least one support fluid reservoir to the at least one support fluid manifold to extend the supporting elements is effected by application of a positive pneumatic pressure to the at least one support fluid reservoir.

5. The method of claim 4, wherein displacement of support fluid from the at least one support fluid manifold to the at least one support fluid reservoir to retract the supporting elements is effected by application of a vacuum to the at least one support fluid reservoir.

6. The method of claim 4, wherein the positive pneumatic pressure exerts a predeterminable pressure to the support fluid corresponding to a force to be exerted by the supporting elements on the workpiece.

7. The method of claim 1, wherein the tooling fixture further comprises at least one drive piston assembly comprising a support fluid drive piston slideably disposed in the respective at least one support fluid reservoir.

8. The method of claim 7, wherein the support fluid drive piston comprises a floating piston.

9. The method of claim 8, wherein displacement of support fluid from the respective at least one support fluid reservoir to the at least one support fluid manifold to extend the supporting elements is effected by application of a positive pressure to the respective at least one support fluid reservoir at a location, with respect to the support fluid drive piston, opposite the fluid connection between the respective at least one support fluid reservoir and the at least one support fluid manifold.

10. The method of claim 9, wherein the positive pressure comprises a pneumatic pressure.

11. The method of claim 9, wherein displacement of support fluid from the at least one support fluid manifold to the respective at least one support fluid reservoir to retract the supporting elements is effected by application of a negative pressure to the respective at least one support fluid reservoir at a location, with respect to the support fluid drive piston, opposite the fluid connection between the respective at least one support fluid reservoir and the at least one support fluid manifold.

12. The method of claim 11, wherein the negative pressure comprises a vacuum.

13. The method of claim 7, wherein displacement of support fluid between the respective at least one support fluid manifold and the respective at least one support fluid reservoir is effected by operation of a hydraulic cylinder connected to the support fluid drive piston via a connecting rod such as to drive the connecting rod selectively in a first direction to displace support fluid from the respective at least one support fluid reservoir to the respective at least one support fluid manifold to extend the supporting elements, and a second, opposite direction to displace support fluid from the respective at least one support fluid manifold to the respective at least one support fluid reservoir to retract the supporting elements.

14. The method of claim 7, wherein displacement of support fluid between the respective at least one support fluid manifold and the respective at least one support fluid reservoir is effected by operation of a pneumatic cylinder connected to the support fluid drive piston via a connecting rod such as to drive the connecting rod selectively in a first direction to displace support fluid from the respective at least one support fluid reservoir to the respective at least one support fluid manifold to extend the supporting elements, and a second, opposite direction to displace support fluid from the respective at least one support fluid manifold to the respective at least one support fluid reservoir to retract the supporting elements.

15. The method of claim 7, wherein the drive piston assembly is operative to exert a predeterminable pressure to the support fluid corresponding to a force to be exerted by the supporting elements on the workpiece.

16. The method of claim 1, wherein the tooling fixture further comprises at least one valve unit fluidly connecting at least one of the at least one support fluid reservoir and at least one of the at least one support fluid manifold.

17. The method of claim 16, wherein the or each valve unit comprises a pressure-sensitive shut-off valve which automatically closes and prevents displacement of support fluid between the respective at least one fluid support reservoir and the respective at least one fluid support manifold when the pressure exerted by the support fluid exceeds a predeterminable value.

18. The method of claim 16, wherein the or each valve unit includes a valve fluidly connecting the respective at least one support fluid reservoir and the respective at least one support fluid manifold for controlling flow of support fluid therebetween, and the tooling fixture further comprises a pressure sensor fluidly connected to the at least one support fluid manifold for detecting the pressure exerted by the support fluid, and a controller operably fluidly connected to the pressure sensor and the valve, with the valve being closed when the pressure exerted by the support fluid exceeds a predeterminable value.

19. The method of claim 16, wherein the or each valve unit includes first and second valves disposed in parallel combination and operably fluidly connecting the respective at least one fluid support reservoir and the respective at least one fluid support manifold, the first valve being a one-way check valve which allows for flow of support fluid from the respective at least one support fluid reservoir to the respective at least one support fluid manifold and the second valve being operable to fluidly connect the respective at least one support fluid manifold to the respective at least one support fluid reservoir in allowing flow of support fluid from the respective at least one support fluid manifold to the respective at least one support fluid reservoir.

20. The method of claim 1, wherein the body includes a plurality of rows of cylinder bores and one support fluid manifold fluidly connected thereto.

21. The method of claim 20, wherein the tooling fixture further comprises one support fluid reservoir operably fluidly connected to the one support fluid manifold.

22. The method of claim 21, wherein the tooling fixture comprises one valve unit operably fluidly connecting the one support fluid reservoir and the one support fluid manifold.

23. The method of claim 1, wherein the body includes a plurality of rows of cylinder bores and a plurality of support fluid manifolds each fluidly connected to a plurality of the rows of cylinder bores.

24. The method of claim 23, wherein the tooling fixture further comprises one support fluid reservoir operably fluidly connected to the support fluid manifolds.

25. The method of claim 24, wherein the tooling fixture comprises one valve unit operably fluidly connecting the one support fluid reservoir and each support fluid manifold.

26. The method of claim 24, wherein the tooling fixture comprises a plurality of valve units each operably fluidly connecting the one support fluid reservoir to a respective one of the support fluid manifolds.

27. The method of claim 23, wherein the tooling fixture further comprises a plurality of support fluid reservoirs each fluidly connected to a respective one of the support fluid manifolds.

28. The method of claim 27, wherein the tooling fixture comprises a plurality of valve units each operably fluidly connecting respective ones of the support fluid reservoirs and the support fluid manifolds.

29. The method of claim 1, wherein the body includes a plurality of rows of cylinder bores and a plurality of support fluid manifolds each fluidly connected to a respective one of the rows of cylinder bores.

30. The method of claim 29, wherein the tooling fixture further comprises one support fluid reservoir operably fluidly connected to the support fluid manifolds.

31. The method of claim 30, wherein the tooling fixture comprises a plurality of valve units each operably fluidly connecting the one support fluid reservoir to a respective one of the support fluid manifolds.

32. The method of claim 29, wherein the tooling fixture further comprises a plurality of support fluid reservoirs each fluidly connected to a respective one of the support fluid manifolds.

33. The method of claim 32, wherein the tooling fixture comprises a plurality of valve units each operably fluidly connecting respective ones of the support fluid reservoirs and the support fluid manifolds.

34. The method of claim 1, wherein the body includes at least one return fluid manifold fluidly connecting the cylinder bores, the cylinder bores being fluidly connected at one end to the respective at least one supply fluid manifold and at another end to the respective at least one return fluid manifold, and displacement of support fluid from at least one of the at least one supply fluid manifold to return the supporting elements to a retracted position is effected by application of a positive pressure to at least one of the at least one return fluid manifold.

* * * * *